US012580149B2

(12) United States Patent
Tacke et al.

(10) Patent No.: US 12,580,149 B2
(45) Date of Patent: Mar. 17, 2026

(54) WORKSTATION, PREPARATION STATION AND METHOD FOR MANIPULATING AN ELECTRON MICROSCOPY GRID ASSEMBLY

(71) Applicant: MAX-PLANCK-GESELLSCHAFT ZUR FÖRDERUNG DER WISSENSCHAFTEN E. V., Munich (DE)

(72) Inventors: Sebastian Tacke, Dortmund (DE); Stefan Raunser, Dortmund (DE)

(73) Assignee: MAX-PLANCK-GESELLSCHAFT ZUR FÖRDERUNG DER WISSENSCHAFTEN E. V., Munich (DE)

( * ) Notice: Subject to any disclaimer, the term of this patent is extended or adjusted under 35 U.S.C. 154(b) by 630 days.

(21) Appl. No.: 17/797,432

(22) PCT Filed: Feb. 4, 2021

(86) PCT No.: PCT/EP2021/052711
§ 371 (c)(1),
(2) Date: Aug. 4, 2022

(87) PCT Pub. No.: WO2021/156390
PCT Pub. Date: Aug. 12, 2021

(65) Prior Publication Data
US 2023/0073506 A1 Mar. 9, 2023

(30) Foreign Application Priority Data
Feb. 4, 2020 (EP) ..................................... 20155315

(51) Int. Cl.
*H01J 37/18* (2006.01)
*B25J 21/02* (2006.01)
(Continued)

(52) U.S. Cl.
CPC ............. *H01J 37/185* (2013.01); *B25J 21/02* (2013.01); *G01N 1/42* (2013.01); *H01J 37/20* (2013.01);
(Continued)

(58) Field of Classification Search
CPC .. H01J 37/00; H01J 37/02; H01J 37/26; H01J 37/28; H01J 37/185; H01J 37/20;
(Continued)

(56) References Cited

U.S. PATENT DOCUMENTS 4,753,887 A * 6/1988 Bellare ..................... G01N 1/42
435/1.3
5,685,771 A * 11/1997 Kleppen ................... B25J 21/02
454/56
(Continued)

FOREIGN PATENT DOCUMENTS

FR 2514685 4/1983

*Primary Examiner* — Jason L Mccormack
(74) *Attorney, Agent, or Firm* — JMB Davis Ben-David

(57) ABSTRACT

The invention relates to a workstation (1), a preparation station (2) and a method for manipulating an electron microscopy grid assembly (3). The workstation (1) comprises a first compartment (101), a first gas inlet (102) for generating an overpressure in the first compartment (101), a first glove (104) and a second glove (105), each being fixed in a respective opening (106, 107) of the workstation (1), wherein the first glove (104) and the second glove (105) are movable in the first compartment (101) to manipulate objects in the first compartment (101), wherein the workstation (1) comprises a port (109) for providing a transfer device (4) for an electron microscopy grid assembly (3) in the first compartment (101). The preparation station (2) comprises a coolant reservoir (201, 202), a first part (210) configured to hold a shuttle (6) for holding an electron microscopy grid assembly (3) in a fixed orientation, wherein the preparation station (2) is configured such that the first (Continued)

part (210) is submergable in the cryogenic coolant when the coolant reservoir (201, 202) contains the cryogenic coolant.

7 Claims, 8 Drawing Sheets

(51) Int. Cl.

| | | |
|---|---|---|
| *G01N 1/42* | (2006.01) | |
| *H01J 37/20* | (2006.01) | |
| *H01J 37/26* | (2006.01) | |

(52) U.S. Cl.
CPC ......... *H01J 37/26* (2013.01); *H01J 2237/184* (2013.01); *H01J 2237/2001* (2013.01); *H01J 2237/2004* (2013.01); *H01J 2237/31745* (2013.01)

(58) Field of Classification Search
CPC ......... H01J 2237/184; H01J 2237/2001; H01J 2237/2004; H01J 2237/31745; H01J 2237/204; B25J 21/02; G01N 1/42; A41D 19/0013
USPC .............. 250/306, 307, 311, 440.11, 441.11, 250/442.11
See application file for complete search history.

(56) References Cited

U.S. PATENT DOCUMENTS

| | | | |
|---|---|---|---|
| 2007/0040118 A1* | 2/2007 | Cheng ................ | G01N 23/2251 250/310 |
| 2007/0169488 A1 | 7/2007 | Oh | |
| 2020/0141961 A1* | 5/2020 | Ahlfors ..................... | B01L 1/04 |
| 2021/0144990 A1* | 5/2021 | Han ........................ | A01N 1/144 |

* cited by examiner

A

B

WORKSTATION, PREPARATION STATION AND METHOD FOR MANIPULATING AN ELECTRON MICROSCOPY GRID ASSEMBLY

CROSS-REFERENCE TO RELATED APPLICATIONS

This is the U.S. National Stage of International Patent Application No. PCT/EP2021/052711 filed on Feb. 4, 2021, which claims priority to European Patent Application No. 20155315.3 filed on Feb. 4, 2020.

The invention relates to a workstation, a preparation station and a method for manipulating an electron microscopy grid assembly, particularly for subsequent imaging of a sample on a grid of the electron microscopy grid assembly by an imaging device, particularly a cryo-electron microscope. Furthermore, the workstation, the preparation station and the method can be used to transfer the electron microscopy grid assembly to a preparation device, particularly a focused ion beam device used for thinning of the sample, and from the preparation device to the imaging device at cryogenic temperatures and with minimal ice contamination.

Electron tomography at cryogenic temperatures, (cryo-ET or electron cryotomography) offers the unique possibility to structurally analyze biological macromolecules in their native cellular environment. Using this method, it is even possible to determine protein structures at near atomic resolution by applying sub-volume averaging techniques. One prerequisite for cryo-electron microscopy, particularly cryo-ET, is that the sample is thinner than the inelastic mean-free-path length of electrons, which is approximately 350 nm for 300 keV electrons.

It is known from the prior art to apply a focused ion beam at cryogenic temperatures (cryo-FIB) to thin samples on an electron microscopy grid assembly prior to analysis by cryo-ET. In this method (also termed cryo-focused ion beam milling), the following steps are typically applied: i) vitrification of the sample, ii) identification of regions of interest, iii) rough ablation of the surrounding sample material and iv) polishing of the target region, leaving a thin lamella ready for cryo-ET (Medeiros, J. M et al. Robust workflow and instrumentation for cryo-focused ion beam milling of samples for electron cryotomography, *Ultramicroscopy* 190, 1-11 (2018)).

The entire procedure involves multiple handling, transfer and imaging steps. During these steps, samples disposed on an electron microscopy grid assembly need to be handled with forceps and it is difficult even for highly experienced practitioners not to destroy the thin and fragile lamellae. Since the vitrified sample acts as a cold trap, it is especially prone to ice contamination. Ice contamination of polished lamellae is particularly disruptive to cryo-ET as ice crystals often obscure the view on features otherwise visible in the lamellae. It is even possible that ice crystals conceal the entire lamella, which precludes any meaningful data acquisition. In particular, the transfer to the cryo-FIB device and from the cryo-FIB device to the cryo-electron microscope bears a high-risk of exposing the sample to water, resulting in ice contamination.

Therefore, the objective underlying the present invention is to provide devices and methods for manipulation (that is, particularly handling and transfer) of an electron microscopy grid assembly which are improved in view of the above discussed drawbacks of the prior art, particularly to provide devices and methods for manipulation of an electron microscopy grid assembly which reduce deposition of ice on the sample during manipulation (particularly handling and transfer).

This objective is attained by the subject matter of the independent claims. Embodiments of the invention are claimed in the dependent claims and are described hereafter.

A first aspect of the invention relates to a workstation, particularly a glove box, for manipulating an electron microscopy grid assembly, wherein the workstation comprises a first compartment and a first gas inlet for providing a gas flow of a dry gas, particularly dry nitrogen gas ($N_2$), from a gas reservoir into the first compartment, wherein the workstation is configured such that an overpressure can be generated in the first compartment by the gas flow relative to an exterior of the workstation, particularly an overpressure of at least 1 bar, more particularly at least 2 bar, even more particularly at least 3 bar above atmospheric pressure of the exterior. The workstation further comprises a first glove and a second glove, each being fixed in a respective opening of the workstation, wherein the first glove and the second glove are configured such that a respective hand of a user may be inserted into the first glove and/or the second glove from the exterior, wherein the first glove and the second glove are movable in the first compartment to manipulate objects in the first compartment using the respective hand of the user.

As used herein, the term electron microscopy grid assembly (or EM grid assembly) describes an assembly comprising at least an electron microscopy grid (EM grid) and optionally comprising additional components, such as a ring. The term electron microscopy grid particularly describes a fine mesh (typically made from copper or gold), which is coated by a holey layer of amorphous carbon or gold. According to known methods, a sample is typically dispensed onto the EM grid in liquid form and vitrified, e.g. by flash freezing in liquid ethane. In particular, the electron microscopy grid assembly described herein comprises an electron microscopy grid and a clamping ring (particularly termed C-clip ring).

The term 'dry gas' as used herein refers to a gas with a relative humidity of 5% or less, particularly a relative humidity of 1% or less.

Advantageously, the first compartment of the workstation provides a working environment for manipulating the electron microscopy grid assembly with a minimum amount of water vapor (due to the dry gas environment in the first compartment), such that ice contamination of the sample on the electron microscopy grid assembly is minimized. Furthermore, due to the overpressure of the dry gas, water vapor from the ambient air of the environment of the workstation cannot enter the first compartment. In particular, to minimize consumption of the dry gas and obtain a sufficient overpressure in the first compartment, the workstation is at least partially sealed (in a gas tight manner) from the exterior.

In certain embodiments, the workstation comprises a port for providing at least a part of a transfer device for an electron microscopy grid assembly in the first compartment to insert the electron microscopy grid into the transfer device or remove the electron microscopy grid from the transfer device in the first compartment. In particular, at least a part of the transfer device can be advanced into the first compartment through the port. In particular, the port comprises a through-hole for receiving a part of the transfer device and advancing the part through the through-hole into the first compartment. Optionally, the port comprises a sealing mechanism to prevent leakage of the dry gas through the port.

By such a port, the electron microscopy grid assembly can be directly transferred to transfer device in the first compartment of the workstation without having to remove the electron microscopy grid assembly from the dry environment of the first compartment. This further reduces ice contamination during transfer of the EM grid assembly.

Such transfer devices are used for example to transfer the electron microscopy grid assembly to a preparation device, particularly a focused ion beam device configured to thin a sample on the electron microscopy grid assembly at cryogenic temperatures.

In particular, the term 'cryogenic temperature' or 'cryogenic temperatures' as used in the present specification relates to temperatures below −140° C.

In particular, the transfer device comprises an outer rod and an inner rod which is arranged in and can be slidably moved relative to the outer rod, wherein the inner rod comprises a tip configured to be connected to a shuttle for holding the electron microscopy grid assembly and configured to move the shuttle with the electron microscopy grid assembly thereon into a chamber of the transfer device, and move the shuttle with the electron microscopy grid assembly thereon into the preparation device, particularly the focused ion beam device, for preparation of the sample on the electron microscopy grid assembly. Particularly, the transfer device comprises a coolant reservoir configured to cool the shuttle when the shuttle is contained in the chamber and the coolant reservoir contains a cryogenic coolant, more particularly during transfer to the preparation device. Furthermore, particularly, the chamber is configured to be evacuated before transfer to the preparation device. The transfer device may further comprise an adapter for connecting the transfer device to the workstation according to the first aspect and/or to the preparation device. In particular, the tip of the inner rod of the transfer device comprises a gripping mechanism configured to grip the shuttle or the tip of the inner rod comprises a first thread (i.e., an outer thread or an inner thread) configured to engage a second corresponding thread of the shuttle (i.e. an inner thread in case of an outer thread of the inner rod tip or an outer thread in case of an inner thread of the inner rod tip), such that the inner rod can be screwed onto the shuttle to connect the shuttle to the inner rod.

In certain embodiments, the port is configured to provide the inner rod of the transfer device in the first compartment. in other words, the part of the transfer device provided in the first compartment (referred to above) may be the inner rod of the transfer device which is used to connect the shuttle harboring the EM grid assembly to the transfer device. In particular, the transfer device and the workstation are configured such that the inner rod may be advanced through the port of the workstation into the first compartment. In particular, an actuation of the transfer device, e.g. to activate the sliding or telescoping mechanism between the inner rod and the outer rod, may be performed from the exterior of the workstation, if only the inner rod is advanced into the first compartment.

In certain embodiments, the port is configured such that the inner rod extends from the port towards a bottom surface delimiting the first compartment of the workstation. In other words, the inner rod particularly does not extend along a horizontal direction, but is oriented downward towards the bottom surface. This has the advantage that the shuttle holding the electron microscopy grid assembly (particularly being arranged on a preparation station according to the second aspect) may conveniently be approached from above by the tip of the inner rod to connect the shuttle to the inner rod.

In particular, the term 'shuttle', as used in this specification, refers to a part suitable for holding at least one electron microscopy grid assembly in a fixed orientation, particularly for transfer of the electron microscopy grid assembly into a preparation device, such as a cryogenic focused ion beam device.

In certain embodiments, the port is configured to enclose the transfer device in a gas tight manner, such that at least the part of the transfer device can be advanced into the first compartment without releasing the overpressure from the first compartment.

In certain embodiments, the port is arranged in a wall, particularly a side wall or side panel, of the workstation delimiting the inner compartment, wherein the wall extends perpendicular to the window or front panel.

In certain embodiments, the workstation comprises at least one gas outlet configured to allow the dry gas to exit the first compartment to an exterior of the workstation. Alternatively, no designated gas outlet may be needed if the workstation is not completely sealed in a gas-tight manner, i.e. the dry gas leaks to a certain extent from openings such as the port for the transfer device or the gloves.

In certain embodiments, the gas inlet and the at least one gas outlet the gas inlet and the gas outlet are configured such that an overpressure can be generated in the first compartment, particularly an overpressure of at least 1 bar, more particularly at least 2 bar, even more particularly at least 3 bar, relative to the exterior. That is, in particular, the inflow rate of the dry gas is set such that the desired overpressure results at a given outflow rate from the first compartment.

In certain embodiments, the openings, in which the first glove and the second glove are fixed, are arranged in a window or a front panel delimiting the first compartment of the workstation. In particular, the first glove and the second glove are fixed around the entire inner circumference of the respective opening, such that the dry gas is unable to exit the first compartment into the exterior between the respective opening and the first or second glove.

In certain embodiments, the first glove and the second glove each comprise a plurality of finger sections, wherein each finger section of the first glove and the second glove is configured to receive a respective finger of a respective hand of the user, wherein each finger section of the first glove and the second glove comprises a respective hole at a tip of the respective finger section, wherein the respective hole is configured to allow the respective finger of the user to extend into the first compartment through the respective hole. Here, the term 'finger section' is used to distinguish the fingers of the first and second glove from the fingers of the user which are to be inserted into the gloves.

As opposed to workstations (i.e. glove boxes) used in other fields such as chemistry, where tightly sealed gloves are crucial to protect the user e.g. from hazardous chemicals, a tightly sealed workstation is not strictly required according to the present invention, since the overpressure of the dry gas the first compartment ensures that no water vapor can enter the first compartment from the exterior, even if gloves with openings are used. On the other hand, the thick material commonly used for gloves of glove boxes according to the prior art would severely impair manipulation of small objects such as the EM grid assembly in the first compartment. Gloves with openings at the fingertips according to the described embodiment significantly improve the ability of the user to manipulate such small objects in the first compartment of the workstation.

In certain embodiments, the workstation comprises a coolant tank for storing a cryogenic coolant, particularly liquid nitrogen ($IN_2$), wherein the workstation comprises a dispensing mechanism configured to dispense the cryogenic coolant from the coolant tank through a coolant outlet into the first compartment, wherein the coolant outlet is arranged in the first compartment.

In the context of the present specification, the term 'cryogenic coolant' describes a substance which is suitable for cooling to cryogenic temperatures, particularly below −140° C.

A coolant tank and dispensing mechanism in the first compartment has the advantage that reservoirs and receptacles of devices and tools used during manipulation of the EM grid assembly to keep the EM grid assembly at cryogenic temperatures can be directly filled with cryogenic coolant in the first compartment, thereby avoiding tedious transfer steps of coolant filled devices and tools into the workstation.

In certain embodiments, the coolant tank is arranged at a back wall or back panel opposite the window or front panel, wherein a gap is arranged between the backwall/back panel and the coolant tank, such that the coolant tank is configured as a cold trap adapted to form ice from residual water vapor in the first compartment. This further contributes to reducing ice contamination on the sample disposed on the EM grid assembly.

In certain embodiments, the coolant tank comprises a thermally insulating material covering the surface of the coolant tank and/or the coolant outlet.

In certain embodiment, the window is transparent, such that the first compartment can be viewed from the exterior through the window or front panel. E.g. the window is composed of plexiglass.

In certain embodiments, the workstation comprises a first guide rail for slidably moving a preparation station for manipulating an electron microscopy grid assembly, particularly a preparation station according to the second aspect of the invention, in the first compartment along a first direction, particularly parallel to the front panel or window.

In certain embodiments, the workstation comprises a second guide rail for slidably moving the preparation station in the first compartment along a second direction non-parallel, particularly perpendicular, to the first direction. In particular, the first guide rail is configured to slidably move the preparation station parallel to the window or front panel of the workstation and the second guide rail is configured to slidably move the preparation station perpendicular to the window or front panel of the workstation.

These guide rails have the advantage that the preparation station can be easily moved to the desired position inside the first compartment to optionally position components, e.g. for mounting the EM grid assembly on the shuttle or inserting the shuttle with the EM grid assembly into the transfer device.

In certain embodiments, the workstation comprises a loading lock comprising or enclosing a second compartment, wherein the loading lock comprises a first gate connecting the second compartment to the first compartment of the workstation, and wherein the loading lock comprises a second gate connecting the second compartment to the exterior of the workstation, wherein the workstation comprises a second gas inlet configured to provide a gas flow of the dry gas into the second compartment, particularly from the gas reservoir or from the first compartment, such that an overpressure of the dry gas can be generated in the second compartment relative to the exterior of the workstation by the gas flow.

The described loading lock has the advantage that components necessary for manipulating the EM grid assembly can be inserted into the first compartment of the workstation from the exterior and removed from the first compartment without releasing the overpressure of the dry gas.

In certain embodiments, the workstation comprises at least one heating element for heating at least a part of the first compartment, particularly for heating a manipulation tool for manipulating an electron microcopy grid assembly to evaporate residual water from the manipulation tool.

By the at least one heating element, residual water can be removed from manipulation tools, as well as other components used during manipulation of the EM grid assembly, such as components of the preparation station according to the second aspect, and inner surfaces of the workstation itself. This further contributes to the reduction of ice contamination on the sample disposed on the EM grid assembly.

In certain embodiments, the workstation comprises a tool holder arranged in the first compartment, wherein the tool holder is configured such that a tool held by the tool holder is heatable by the at least one heating element of the workstation.

In certain embodiments, the workstation comprises a pump inlet, wherein the pump inlet is configured to be connected to a vacuum pump, particularly wherein the vacuum pump is configured to evacuate a chamber of the transfer device for the electron microscopy grid assembly when the transfer device is arranged in the port of the workstation. In particular, the workstation comprises the vacuum pump connected to the pump inlet. The chamber of the transfer device may be evacuated by connecting the transfer device to a vacuum pump inlet. The pump inlet may be arranged in the first compartment or outside of the first compartment.

The vacuum pump allows to directly evacuate devices, such as the transfer device, in the first compartment, such that external evacuation steps are avoided, which contributes to the reduction of ice contamination on the sample.

In certain embodiments, the workstation comprises a magnifying device configured such that a user may view the electron microscopy grid assembly through the magnifying device while manipulating the electron microscopy grid assembly in the first compartment, wherein particularly the magnifying device comprises a light source configured to illuminate the electron microscopy grid assembly during manipulation of the electron microscopy grid assembly in the first compartment, wherein more particularly the light source is a fiber optic arranged at least partially around a viewing area of the magnifying device.

Advantageously, the magnifying device aids the user in viewing and manipulating small components, such as the EM grid assembly, in the first compartment.

A second aspect of the invention relates to a preparation station for manipulating an electron microscopy grid assembly, wherein the preparation station comprises a coolant reservoir for receiving a cryogenic coolant, particularly liquid nitrogen ($IN_2$), and wherein the preparation station comprises a first part (or first module) configured to be inserted into the coolant reservoir, such that an upper surface of the first part is accessible from above the coolant reservoir, wherein the first part is configured to hold a shuttle for holding an electron microscopy grid assembly in a fixed orientation, wherein particularly the shuttle is configured to be inserted into a preparation device, more particularly a focused ion beam device for thinning of a sample arranged on the electron microscopy grid assembly.

The preparation station is configured such that the first part is submerged or submergable in the cryogenic coolant when the coolant reservoir contains the cryogenic coolant. In other words, the coolant reservoir and the first part are configured (that is adapted and arranged with respect to each other) such that the first part is submerged or submergable in the cryogenic coolant when the coolant reservoir contains the cryogenic coolant.

Using the preparation station, the EM grid assembly can be manipulated in a convenient manner, while it remains at cryogenic temperatures, particularly in the first compartment of the workstation according to the first aspect of the invention. Therein, particularly the first part may be used to load an EM grid assembly onto a shuttle for holding the EM grid assembly or insert an EM grid assembly into the shuttle, particularly in the workstation according to the first aspect of the invention. Therein, manipulation of the EM grid assembly may be performed with a tool such as forceps, tongues, or tweezers, particularly by means of the first and second glove of the workstation.

In certain embodiments, the preparation station comprises a removable holder comprising at least one holding element for holding the shuttle in a fixed orientation, wherein the first part comprises a first recess for receiving the holder in a fixed orientation with respect to the first part.

The removable holder fixes the shuttle in a defined orientation on the preparation station and facilitates the transfer of the shuttle between different parts or modules of the preparation station in an easy manner.

In certain embodiments, the removable holder is separate from the first part.

In certain embodiments, the removable holder comprises a first holding element and a second holding element configured to hold, particularly clamp, the shuttle between the first holding element and the second holding element, wherein particularly the removable holder is configured such that the shuttle can be slid between the first and the second holding element to mount the shuttle on the removable holder or remove the shuttle from the removable holder.

In certain embodiments, the removable holder comprises a protrusion, particularly arranged in a first groove, for gripping the removable holder with a tool, particularly forceps, tweezers or tongues.

In certain embodiments, the removable holder comprises a first pin configured to engage a first slot of the first part in the first recess or adjacent to the first recess and a second pin configured to engage a second slot of the first part in the first recess or adjacent to the first recess.

In certain embodiments, the first part comprises a first hole arranged adjacent to the first recess on a first side of the first recess and a second hole arranged adjacent to the first recess on a second side of the first recess opposite the first side, wherein the first and the second hole are each configured to receive a respective screw to fix the removable holder in the first recess. In particular, the first hole and the second hole each comprise a female thread configured to be engaged by a male thread of the respective screw.

In certain embodiments, the first part comprises at least one second recess for receiving a container for receiving at least one electron microscopy grid assembly.

In certain embodiments, the first part comprises a second recess arranged on a first side of the first recess and a second recess arranged on a second side of the first recess opposite the first side, the second recess each being configured to receive a container for receiving at least one electron microscopy grid assembly.

In certain embodiments, the first recess comprises a surface which is parallel to the upper surface of the first part, such that the shuttle is oriented parallel to the upper surface when the shuttle is held by the at least one holding element of the removable holder.

In certain embodiments, the preparation station comprises a second part (or second module) configured to be inserted into the coolant reservoir, such that an upper surface of the second part is accessible from above the coolant reservoir, wherein the second part is configured to hold the shuttle in a tilted orientation in respect of the upper surface of the second part, wherein the preparation station is configured such that the second part is submerged or submergable in the cryogenic coolant when the coolant reservoir contains the cryogenic coolant.

In the context of the present specification, the expressions 'tilted' or 'tilted orientation' designate an orientation at an angle between 0° and 90°. In other words, two surfaces being in a tilted orientation with respect to each other are neither parallel nor perpendicular to each other.

In particular, the second part is configured to position the shuttle with the EM grid assembly thereon in an orientation where it can be connected to or inserted into a transfer device, more particularly used to transfer the shuttle into a preparation device, e.g., a focused ion beam device. The tilted orientation of the shuttle is advantageous to position the shuttle with respect to the transfer device, such that the shuttle can be easily connected to the transfer device.

In certain embodiments, the second part comprises a second recess for receiving the removable holder, wherein the second recess comprises a surface which is tilted in respect of the upper surface of the second part, such that the shuttle is in said tilted orientation when the shuttle is held by the at least one holding element of the removable holder.

In certain embodiments, the coolant reservoir and the second part are configured (that is adapted and arranged with respect to each other) such that the second part is submerged or submergable in the cryogenic coolant when the coolant reservoir contains the cryogenic coolant.

In certain embodiments, the shuttle is configured to be inserted into a focused ion beam device for thinning of a sample disposed on the electron microscopy grid assembly.

In certain embodiments, the second part is configured such that the removable holder protrudes above the upper surface of the second part, when the removable holder is received in the second recess.

In certain embodiments, the removable holder comprises a first pin configured to engage a first slot of the second part in the second recess or adjacent to the second recess and a second pin configured to engage a second slot of the second part in the second recess or adjacent to the second recess.

In certain embodiments, the second part comprises a first hole arranged adjacent to the second recess on a first side of the second recess and a second hole arranged adjacent to the second recess on a second side of the second recess opposite the first side, wherein the first and the second hole are each configured to receive a respective screw to fix the removable holder in the second recess. In particular, the first hole and the second hole each comprise a female thread configured to be engaged by a male thread of the respective screw.

In certain embodiments, the preparation station comprises a third part (or third module) configured to be inserted in the coolant reservoir, such that an upper surface of the third part is accessible from above the coolant reservoir, wherein the third part is configured to hold a cassette for holding the electron microscopy grid assembly, wherein the cassette is configured to be inserted into an imaging device, particularly a cryo-electron microscope, to image a sample on the electron microscopy grid assembly.

In certain embodiments, the third part comprises a third recess for receiving the cassette, wherein more particularly the third recess comprises a surface which is tilted in respect of the upper surface of the third part, such that the cassette is in a tilted orientation with respect to the upper surface of the third part when the cassette is received in the third recess.

In the context of the present specification, the term 'cassette' designates a part comprising at least one slot for holding an EM grid assembly in a fixed orientation, wherein the part is configured to be inserted into an imaging device, particularly a cryo-electron microscope. In particular, the cassette is configured to be inserted into a transfer receptacle, wherein the transfer receptacle is configured to be inserted into the imaging device, particularly the cryo-electron microscope.

In particular, the third part is configured to position the shuttle and the cassette relative to each other, such that the EM grid assembly can be directly transferred from the shuttle to the cassette, more particularly in a convenient manner, e.g. such that the EM grid assembly has the same orientation in the shuttle (on the removable holder) in the fourth recess and the cassette in the third recess.

In certain embodiments, the third part is further configured to hold the shuttle for holding the electron microscopy grid assembly.

In certain embodiments, the third part comprises a fourth recess for receiving the removable holder.

In certain embodiments the third recess comprises a first section and a second section extended along a first direction, wherein the first section comprises a first width perpendicular to the first direction, and the second section comprises a second width perpendicular to the first direction, wherein the first width is greater than the second width.

In certain embodiments, the third part further comprises a fifth recess for receiving the cassette, wherein the third recess extends along a first direction and the fifth recess extends along a second direction perpendicular to the first direction, such that the cassette extends along the first direction when the cassette is received in the third recess, and the cassette extends along the second direction when the cassette is received in the fifth recess.

In particular, the cassette may be placed in the third recess or the fifth recess of the third part to position the cassette optimally to transfer the EM grid assembly from the shuttle to the cassette, or to insert the cassette into the transfer receptacle, particularly depending on the tool that is used for this purpose. The tilted orientation of the surface of the third recess facilitates positioning the EM grid assembly in the cassette, particularly in the same orientation as on the alignment table. In particular, the cassette may be initially placed in the third recess to insert the EM grid assembly into the cassette, and subsequently transferred from the third recess to the fifth recess prior to loading the cassette into the transfer receptacle.

Alternatively, the EM grid assembly can be transferred from a container, particularly placed in the sixth recess, to the cassette arranged in the fifth recess, and the cassette may be subsequently transferred to the transfer receptacle. This application is particularly useful for single particle cryo-electron microscopy, where the preparation step, particularly the thinning of the sample by cryo-FIB, can be omitted, and therefore fixing the EM grid assembly on the shuttle is unnecessary.

In certain embodiments, the fifth recess comprises a surface, which is parallel to the upper surface of the third part, such that the cassette is oriented parallel to the upper surface of the third part when the cassette is received in the fifth recess.

In certain embodiments, the upper surface of the first part, the second part and/or the third part extends in a horizontal direction when the respective first, second and/or third part is inserted in the coolant reservoir of the preparation station.

In certain embodiments, the first part, the second part and/or the third part, particularly the first part, comprises at least one alignment groove for receiving an electron microscopy grid assembly in a tilted orientation with respect to an upper surface of the respective first part, second part or third part, wherein the at least one alignment groove is configured for aligning (that is particularly rotationally orienting) the electron microscopy grid assembly in the alignment groove, particularly rotationally aligning the electron microscopy grid assembly about a central axis of the electron microscopy grid assembly.

In certain embodiments, the alignment groove comprises a first surface which is tilted with respect to the upper surface of the first part, wherein the alignment groove is configured (that is dimensioned and arranged) such that the electron microcopy grid assembly protrudes above the upper surface of the first part from the alignment groove when the electron microscopy grid assembly is arranged in the alignment groove.

For certain applications, such as milling of the sample in the focused ion beam device and performing a tilting series in a cryo-electron microscope, the EM grid assembly has to be inserted into the respective holder (shuttle or cassette) in a defined rotational orientation. Aligning (particularly rotationally orienting) the EM grid assembly in this orientation is facilitated by the alignment groove, wherein due to the tilted surface and the depth of the alignment groove, the EM grid assembly can be easily gripped and turned from above using a manipulation tool such as forceps.

In certain embodiments, the first part comprises a first alignment groove arranged on a first side of the first recess and a second alignment groove arranged on a second side of the first recess opposite the first side, wherein the first alignment groove and the second alignment groove are each configured to receive an electron microscopy grid assembly in a tilted orientation with respect to an upper surface of the first part to align (particularly rotationally orient) the electron microscopy grid assembly in the respective first or second alignment groove.

In certain embodiments, the first and the second alignment groove are configured (that is dimensioned and arranged) such that the electron microcopy grid assembly protrudes above the upper surface of the respective first part, second part or third part from the first alignment groove or the second alignment groove when the electron microscopy grid assembly is arranged in the respective first or second alignment groove.

In particular, the first and the second alignment groove are each configured for aligning (particularly rotationally orienting) the electron microscopy grid assembly about a central axis of the electron microscopy grid assembly.

In particular, the first and the second alignment groove each comprises a first surface which is tilted with respect to the upper surface of the first part.

In certain embodiments, the first part, the second part and/or the third part, particularly the third part, comprises an alignment platform for aligning (particularly rotationally orienting) the electron microscopy grid assembly on the alignment platform, wherein particularly the alignment platform comprises a surface which is tilted in respect of the upper surface of the respective first, second or third part, wherein particularly the surface comprises a groove for receiving the electron microscopy grid assembly and/or a slot for receiving a manipulation tool, such that the electron microscopy grid assembly can be aligned by the manipulation tool, when the electron microscopy grid assembly is inserted in the groove and the manipulation tool is inserted in the slot.

For certain applications, such as milling of the sample in the focused ion beam device and performing a tilt-series in a cryo-electron microscope, the EM grid assembly has to be inserted into the respective holder (shuttle or cassette) in a defined rotational orientation. Aligning the EM grid assembly in this orientation is facilitated by the alignment platform, wherein due to the tilted surface, dimensions, groove and slot of the alignment groove, the EM grid assembly can be easily manipulated by manipulation tools.

In certain embodiments, the alignment platform is arranged between the third recess and the fourth recess of the third part. This facilitates placing the EM grid assembly from the shuttle (on the removable holder in the fourth recess) onto the alignment platform, aligning (particularly rotationally orienting) the EM grid assembly, and inserting the EM grid assembly into the cassette in the third recess.

In certain embodiments, the removable holder comprises a first pin configured to engage a first slot of the third part in the fourth recess or adjacent to the fourth recess and a second pin configured to engage a second slot of the third part in the fourth recess or adjacent to the fourth recess.

In certain embodiments, the third part comprises a first hole arranged adjacent to the fourth recess on a first side of the fourth recess and a second hole arranged adjacent to the fourth recess on a second side of the fourth recess opposite the first side, wherein the first and the second hole are each configured to receive a respective screw to fix the removable holder in the fourth recess. In particular, the first hole and the second hole each comprise a female thread configured to be engaged by a male thread of the respective screw.

In certain embodiments, the third part comprises a sixth recess for receiving a container for receiving at least one electron microscopy grid assembly.

In certain embodiments, the fourth recess comprises a surface which is parallel to the upper surface of the third part, such that the shuttle is oriented parallel to the upper surface when the shuttle is held by the removable holder.

In certain embodiments, the coolant reservoir of the preparation station comprises a first slot for receiving the first part and/or a second slot for receiving the second part and/or a third slot for receiving the third part, wherein particularly the first slot, the second slot and/or the third slot is/are arranged at a bottom surface of the coolant reservoir.

In certain embodiments, the preparation station comprises a first coolant reservoir and a second coolant reservoir in fluid communication with the first coolant reservoir.

In certain embodiments, the preparation station comprises at least one tool holder for holding a tool, such that the tool is submergable or submerged in the cryogenic coolant when the cryogenic coolant is contained in the coolant reservoir.

In certain embodiments, the coolant reservoir comprises a plurality of fourth slots, wherein the fourth slots are configured to receive a fourth part, particularly a clipping station, wherein particularly the fourth slots are arranged along a circle at the bottom of the coolant reservoir.

In certain embodiments, the preparation station comprises at least one opening for supplying the cryogenic coolant into the coolant reservoir and/or remove the cryogenic coolant from the coolant reservoir.

In certain embodiments, the preparation station comprises an adapter, particularly a removable adapter, for holding a transfer receptacle for receiving a cassette for holding the electron microscopy grid assembly, wherein the transfer receptacle comprising or containing the cassette is configured to be inserted into an imaging device, particularly a cryo-electron microscope, to image a sample on the electron microscopy grid assembly.

The adapter facilitates placing the transfer receptacle in a desired orientation for inserting the cassette into the transfer receptacle, particularly in the first compartment of the workstation.

In certain embodiments, the preparation station comprises a slot for receiving the adapter. In certain embodiments, the preparation station extends between a first end and a second end opposite the first end, wherein the preparation station comprises a first slot and a second slot, each configured to receive the adapter.

In certain embodiments, the slot is formed by a first latch and a second latch comprised in the preparation station. In certain embodiments, the first slot and the second slot are formed by respective first and second latches comprised in the preparation station.

In certain embodiments, the transfer receptacle is configured to receive a cryogenic coolant to keep the electron microscopy grid assembly at cryogenic temperature.

In certain embodiments, the adapter comprises a supporting plate comprising a through-hole for inserting the cassette into the transfer receptacle when the transfer receptacle is held by the adapter.

In certain embodiments, the adapter is configured to hold the transfer receptacle in an orientation such that an upper surface of the transfer receptacle is tilted in respect of the upper surface of the third part, second part and/or third part of the preparation station. This facilitates insertion of the cassette into the transfer receptacle.

A third aspect of the invention relates to a system comprising a workstation according to the first aspect and a preparation station according to the second aspect.

A fourth aspect of the invention relates to a transfer device for an EM grid assembly.

In certain embodiments, the transfer device comprises an outer rod and an inner rod which is arranged in and can be slidably moved relative to the outer rod.

In certain embodiments, the transfer device comprises a chamber for receiving the EM grid assembly, particularly wherein the transfer device comprises a coolant reservoir configured to cool the shuttle to cryogenic temperatures when the shuttle is contained in the chamber and the coolant reservoir contains a cryogenic coolant. In particular, the chamber is configured to be evacuated, such that the chamber contains at least a partial vacuum, more particularly a vacuum of less than $10^{-6}$ mbar.

In certain embodiments, the transfer device, particularly the inner rod, comprises a tip configured to be connected to a shuttle for holding the electron microscopy grid assembly and configured to move the shuttle with the electron microscopy grid assembly thereon into a chamber of the transfer device, and/or move the shuttle with the electron microscopy grid assembly thereon into a preparation device, particularly a focused ion beam device, for preparation of the sample on the electron microscopy grid assembly.

In certain embodiments, the transfer device, particularly the tip of the inner rod of the transfer device, comprises a gripping mechanism configured to grip the shuttle.

In certain embodiments, the transfer device, particularly the tip of the inner rod of the transfer device, comprises a first thread (i.e., an outer thread or an inner thread) configured to engage a corresponding second thread of the shuttle (i.e. an inner thread in case of an outer thread of the transfer device or an outer thread in case of an inner thread of the transfer device), such that the inner rod can be screwed onto the shuttle to connect the shuttle to the transfer device.

In certain embodiments, the transfer device further comprises an adapter for connecting the transfer device to the workstation according to the first aspect and/or to the preparation device.

In certain embodiments, the transfer device further comprises a valve, particularly a vacuum valve, for evacuating the chamber, i.e. when a pump inlet of a vacuum pump is connected to the valve.

In certain embodiments, the chamber of the transfer device comprises a window for viewing the shuttle comprising the EM grid assembly from the exterior.

In certain embodiments, the transfer device comprises a coolant reservoir for containing a cryogenic coolant, wherein the coolant reservoir is configured to be brought in thermal contact with the shuttle when the shuttle is contained in the chamber (particularly in a parking position) and the coolant reservoir contains the cryogenic coolant.

A fifth aspect of the invention relates to a system comprising a workstation according to the first aspect, a transfer device according to the fourth aspect and/or a preparation station according to the second aspect.

A sixth aspect of the invention relates to a method for manipulating an electron microscopy grid assembly comprising (in any order) at least the following steps (any one of which may be performed at cryogenic temperature):

providing a workstation according to the first aspect,
  providing a gas flow of a dry gas to generate an overpressure in the first compartment of the workstation in respect of the exterior of the workstation,
  providing in the first compartment a sample arranged on a grid of an electron microscopy grid assembly, wherein particularly the EM grid assembly is at cryogenic temperature,
  arranging and fixing the electron microscopy grid assembly on a shuttle in a fixed orientation, particularly by means of the preparation station according to the second aspect, particularly wherein the shuttle is held by the removable holder of the preparation station, more particularly wherein the removable holder is received in the first recess of the first part of the preparation station,
  providing a transfer device for an electron microscopy grid assembly in the first compartment by means of the port of the workstation,
  connecting the transfer device to the shuttle and/or inserting the shuttle into a chamber of the transfer device,
  inserting the shuttle into a preparation device, particularly a focused ion beam device, by means of the transfer device,
  preparing the sample on a grid of the electron microscopy grid assembly, particularly thinning the sample arranged on the grid of the electron microscopy grid assembly by a focused ion beam at cryogenic temperatures by means of the focused ion beam device.

In certain embodiments, the method comprises, aligning, particularly rotationally orienting, the electron microscopy grid assembly, particularly on a preparation station according to the second aspect, wherein a cryogenic coolant is contained in the coolant reservoir, and the electron microscopy grid assembly is submerged in the cryogenic coolant, wherein the preparation station is arranged in the first compartment of the workstation, particularly wherein the electron microscopy grid assembly is aligned (particularly rotationally oriented) in the alignment groove of the first part, second part or third part, particularly the first part, of the preparation station or on the alignment platform of the first part, the second part or the third part, particularly the third part, of the preparation station.

In certain embodiments, the method further comprises providing in the first compartment of the workstation according to the first aspect a transfer device comprising a shuttle and an electron microscopy grid assembly comprising a sample, the EM grid assembly being held by the shuttle, wherein the transfer device is provided in the first compartment of the workstation by means of the port of the workstation.

In certain embodiments, the method further comprises removing the electron microscopy grid assembly from the shuttle in the first compartment, particularly by the preparation station according to the second aspect.

In certain embodiments, the method further comprises inserting the electron microscopy grid assembly into a cassette for holding an electron microscopy grid assembly in the first compartment, particularly by the preparation station according to the second aspect.

In certain embodiments, the method further comprises inserting the cassette into a transfer receptacle in the first compartment, particularly by means of the adapter of the preparation station, wherein particularly the transfer receptacle contains a cryogenic coolant.

In certain embodiments, the method further comprises removing the transfer receptacle from the workstation, particularly by means of the loading lock.

In certain embodiments, the method further comprises inserting the transfer receptacle into an imaging device, particularly a cryo-electron microscope.

In certain embodiments, the method further comprises imaging the sample on the electron microscopy grid assembly by means of the cryo-electron microscope.

In certain embodiments, the method comprises arranging the removable holder with the shuttle in the second recess of the second part of the preparation station.

In certain embodiments, the method comprises, particularly after arranging and fixing the electron microscopy grid assembly on the shuttle, advancing at least a part of the transfer device for an electron microscopy grid assembly through the port of the workstation into the first compartment of the workstation from the exterior, wherein particularly the port encloses the transfer device in a gas tight manner.

In certain embodiments, a vacuum is generated in the chamber of the transfer device, particularly by the vacuum pump of the workstation.

In certain embodiments, the coolant reservoir of the transfer device contains a cryogenic coolant, wherein the EM grid assembly in the chamber of the transfer device is cooled by the cryogenic coolant.

In certain embodiments, the chamber of the transfer device is cooled to cryogenic temperature.

In certain embodiments, the method comprises removing the transfer device from the port of the workstation, particularly after inserting the shuttle into the chamber of the transfer device and before inserting the transfer device into the preparation device.

In certain embodiments, the method comprises removing the shuttle from the preparation device by means of the transfer device, particularly after preparing, e.g. thinning, the sample.

In certain embodiments, the method comprises, particularly after removing the shuttle from the preparation device, advancing at least a part of the transfer device through the port of the workstation into the first compartment of the workstation from the exterior, particularly wherein the port encloses the transfer device in a gas tight manner.

In certain embodiments, the method comprises arranging the removable holder in the fourth recess of the third part of the preparation station, In certain embodiments, the method comprises arranging the cassette into the third recess or the fifth recess of the third part of the preparation station.

In certain embodiments, the method comprises aligning, particularly rotationally orienting, the electron microscopy grid assembly, particularly on the alignment platform of the first part, second part or third part of the preparation station, particularly the third part.

In certain embodiments, the method comprises arranging the removable adapter on the preparation station and placing a transfer receptacle in or on the removable adapter.

A seventh aspect of the invention relates to a method for manipulating an electron microscopy grid assembly comprising (in any order) at least the following steps (any one of which may be performed at cryogenic temperature):

providing a workstation according to the first aspect, providing a gas flow of a dry gas to generate an overpressure in the first compartment of the workstation in respect of the exterior of the workstation, providing in the first compartment of the workstation a transfer device comprising a shuttle and an electron microscopy grid assembly comprising a sample, the EM grid assembly being held by the shuttle, wherein the transfer device is provided in the first compartment of the workstation by means of the port of the workstation, removing the electron microscopy grid assembly from the shuttle in the first compartment, particularly by the preparation station according to the second aspect, inserting the electron microscopy grid assembly into a cassette for holding an electron microscopy grid assembly in the first compartment, particularly by the preparation station according to the second aspect, inserting the cassette into a transfer receptacle in the first compartment, particularly by means of the adapter of the preparation station, wherein particularly the transfer receptacle contains a cryogenic coolant, removing the transfer receptacle from the workstation, particularly by means of the loading lock, inserting the transfer receptacle into an imaging device, particularly a cryo-electron microscope, imaging the sample on the electron microscopy grid assembly by means of the imaging device, particularly the cryo-electron microscope.

In certain embodiments, the method comprises advancing at least a part of the transfer device for an electron microscopy grid assembly through the port of the workstation into the first compartment of the workstation from the exterior, wherein particularly the port encloses the transfer device in a gas tight manner.

In certain embodiments, the method comprises arranging the removable holder with the shuttle in the second recess of the second part of the preparation station.

In certain embodiments, a vacuum is generated in the chamber of the transfer device, particularly by the vacuum pump of the workstation.

In certain embodiments, the coolant reservoir of the transfer device contains a cryogenic coolant, wherein the EM grid assembly in the chamber of the transfer device is cooled by the cryogenic coolant.

In certain embodiments, the chamber of the transfer device is cooled to cryogenic temperature.

In certain embodiments, the method comprises arranging the removable holder in the fourth recess of the third part of the preparation station, In certain embodiments, the method comprises arranging the cassette into the third recess or the fifth recess of the third part of the preparation station.

In certain embodiments, the method comprises aligning, particularly rotationally orienting, the electron microscopy grid assembly, particularly on the alignment platform of the first part, second part or third part of the preparation station, particularly the third part.

In certain embodiments, the method comprises arranging the removable adapter on the preparation station and placing a transfer receptacle in or on the removable adapter.

Furthermore, an eighth aspect of the present invention relates to a method for contamination free transfer and handling of a cryo electron microscopy sample, characterized by:

that all sample handling is performed in an anhydrous environment or in an environment with minimized humidity (less than 1%). The environment can be either a dry nitrogen or vacuum (i.e. a vacuum having a pressure in the range from 100 mPa to 100 nPa).

All tools, including the preparation station (e.g. according to one of the aspects/embodiments described herein), which are needed for sample handling and preprocessing, are placed in this environment and;

The transfer of the specimen to other microscopes is done under the very same conditions.

According to an embodiment, this preparation station is heated to a temperature of at least 40 degrees in order to dry all components (tools, preparation station).

According to a further embodiment, a freezer (that is, a device by which the cryo EM sample is frozen into a vitreous state) is placed under the same dry conditions.

According to yet another embodiment, all sample handling is done by a robotic arm.

Wherever alternatives for single separable features are laid out herein as "embodiments", it is to be understood that such alternatives may be combined freely to form discrete embodiments of the invention disclosed herein.

The invention is further illustrated by the following examples and figures, from which further embodiments and advantages can be drawn. These examples are meant to illustrate the invention but not to limit its scope.

Figure 1:
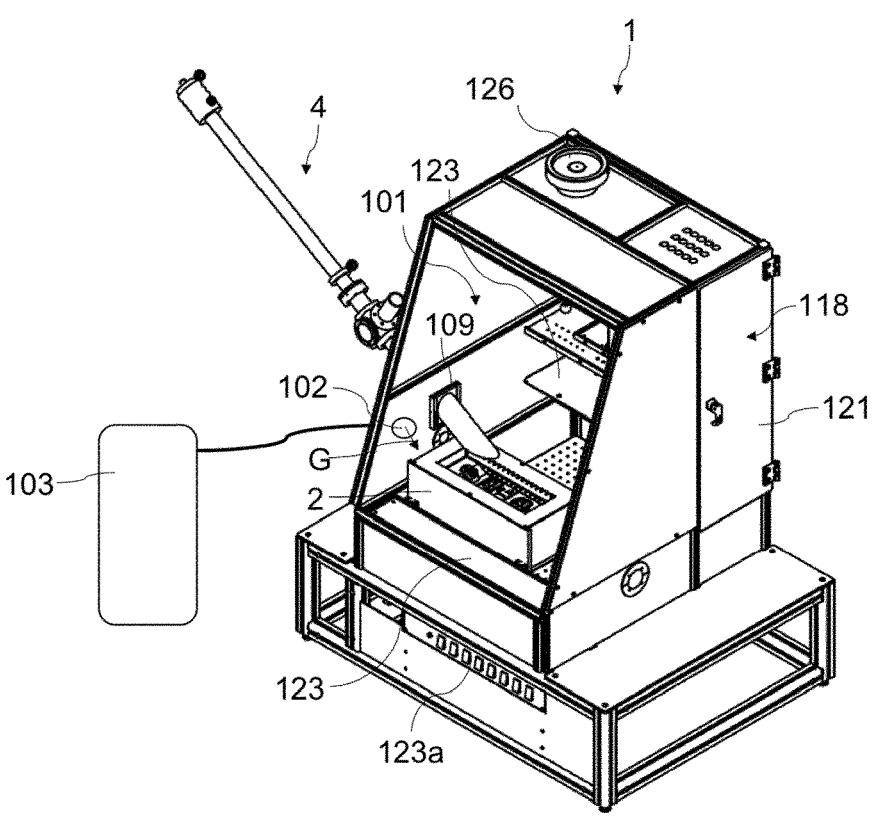
FIG. 1 shows a workstation according to the invention in a perspective view.
Figure 2:
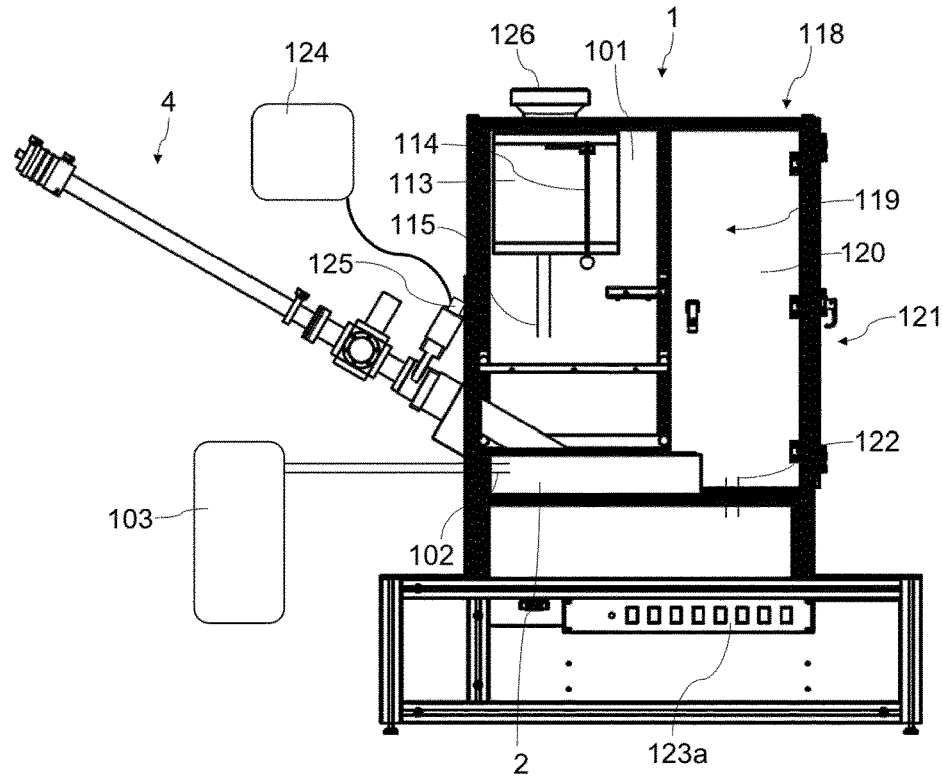
FIG. 2 shows a front view of the workstation according to FIG. 1, without the front panel or window.
Figure 3:
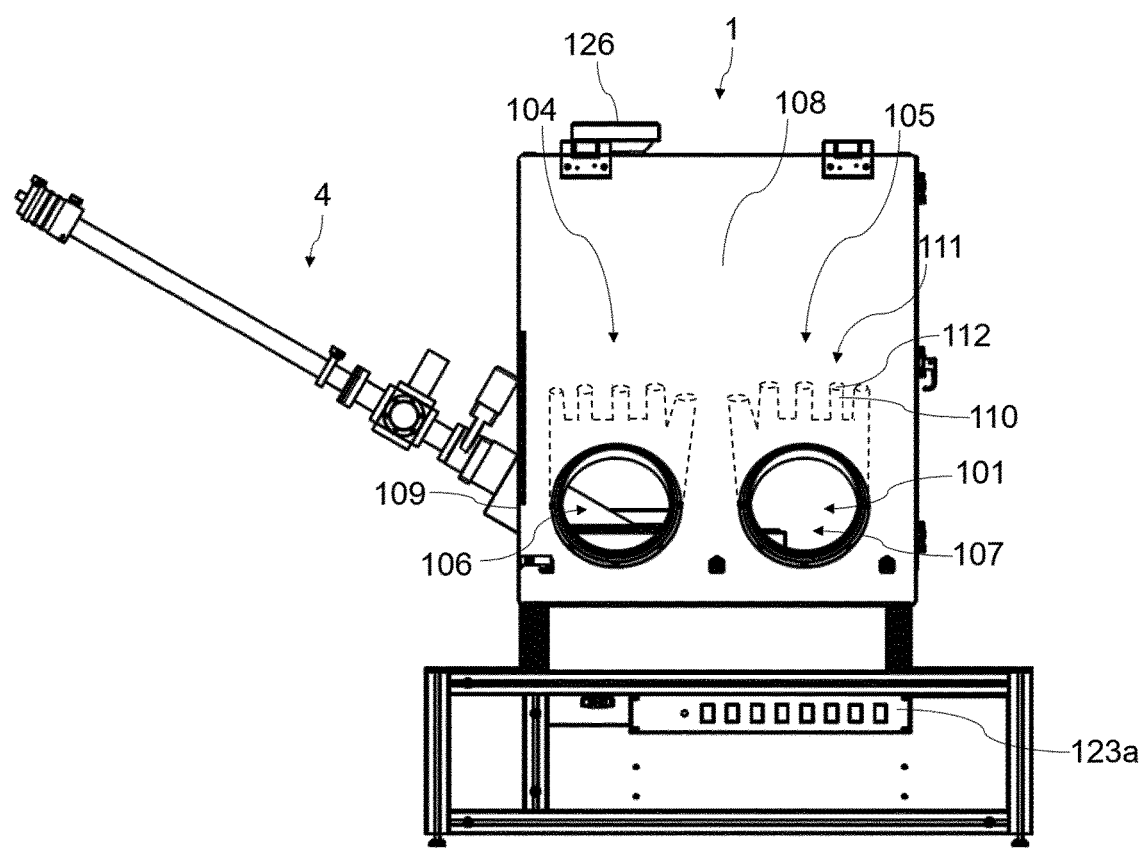
FIG. 3 shows a further front view of the workstation according to FIGS. 1 and 2. Comprising the front panel or window and a schematic representation of a first glove and a second glove of the workstation.

FIG. 1-3 show an embodiment of the workstation 1 according to the invention. The workstation 1 is particularly suited for manipulation of an EM grid assembly 3 (see FIG. 4A), more particularly for placing an EM grid assembly 3 containing a vitrified sample S on a shuttle 6 (see FIG. 4B), transferring the EM grid assembly 3 to a transfer device 4 (see FIG. 5) for inserting the EM grid assembly 3 into a preparation device, such as a cryo-focused ion beam (FIB) device and/or for transferring the EM grid assembly 3 from the shuttle 6 to a cassette 7 (see FIG. 4C) to insert the cassette 7 into an imaging device, such as a cryo-electron microscope to image the sample S.

FIG. 1 is a perspective view of the workstation 1, where the front panel or window 108 (see FIG. 3) has been omitted for better visibility of the internal components of the workstation 1 The workstation 1 comprises a first compartment 101 enclosed by walls and said front panel 108 (see FIG. 3). The workstation 1 further comprises a first gas inlet 102 branching into the first compartment 101, wherein the first gas inlet 102 is connected to a gas reservoir 103, such that a gas flow G of a dry gas, particularly dry nitrogen gas, into the first compartment 101 can be provided to generate an overpressure in the first compartment 101 with respect to the exterior of the workstation 1. This overpressure of the dry gas prevents ice contamination of the sample S on the EM grid assembly 3, thereby allowing longer preparation times.

FIG. 1 further shows a port 109 for inserting at least a part of a transfer device 4 into the first compartment 101 and FIG. 1 shows a preparation station 2 according to the invention, which is arranged in the first compartment 101 (see FIG. 6-13 for details). The transfer device 4 can be arranged with respect to the preparation station 2, particularly to connect a shuttle 6 carrying the EM grid assembly 3 to the transfer device 4 and insert the shuttle 6 into the transfer device 4 or to remove the shuttle 6 from the transfer device 4. In the example shown in FIG. 1, the port 109 is configured such that the transfer device 4 extends from the port 109 downwards towards the preparation station 2 to conveniently connect the shuttle 6 to the transfer device 4.

FIG. 3 shows the workstation 1 in a front view depicting the front panel or window 108, which is particularly transparent, e.g., made from plexiglass or similar material, such that the first compartment 101 can be viewed from outside through the front panel or window 108. The front panel 108 comprises a first opening 106 and a second opening 107, wherein a first glove 104 is connected to the first opening 106, and a second glove 105 is connected to the second opening 107 in a similar manner to glove boxes known from the prior art, i.e. the respective glove 104, 105 is connected around the entire circumference of the first or second opening 106, 107 in a gas tight manner. The first glove 104 is configured for insertion of a left hand of a user and the second glove 105 is configured for insertion of a right hand of the user, wherein the fingers of the hand of the user are to be inserted in the fingers sections 110 of the first and second glove 104, 105. The first and second gloves 104, 105 may be moved around in the first compartment 101, e.g. to manipulate the EM grid assembly 3 in a similar manner to conventional glove boxes known from the prior art. However, according to an embodiment of the invention which is shown in FIG. 3, the finger sections 110 may comprise holes 112 at their tips 111, such that the first glove 104 and the second glove 105 are open towards the first compartment 101. Thereby, the fingers of the user can be extended through the holes 112 to manipulate objects in the first compartment 101 without being obstructed by the thick material which is commonly used for gloves of glove boxes according to the prior art.

As can be best observed in FIG. 2, the workstation 1 further comprises a coolant tank 113 for storing a cryogenic coolant such as liquid nitrogen, the coolant tank 113 being arranged within the first compartment 101 and comprising a coolant inlet 126 configured to fill the coolant tank 113 with cryogenic coolant from the exterior, wherein the coolant inlet 126 is arranged outside of the first compartment 101 on top of the workstation 1.

Figure 14:
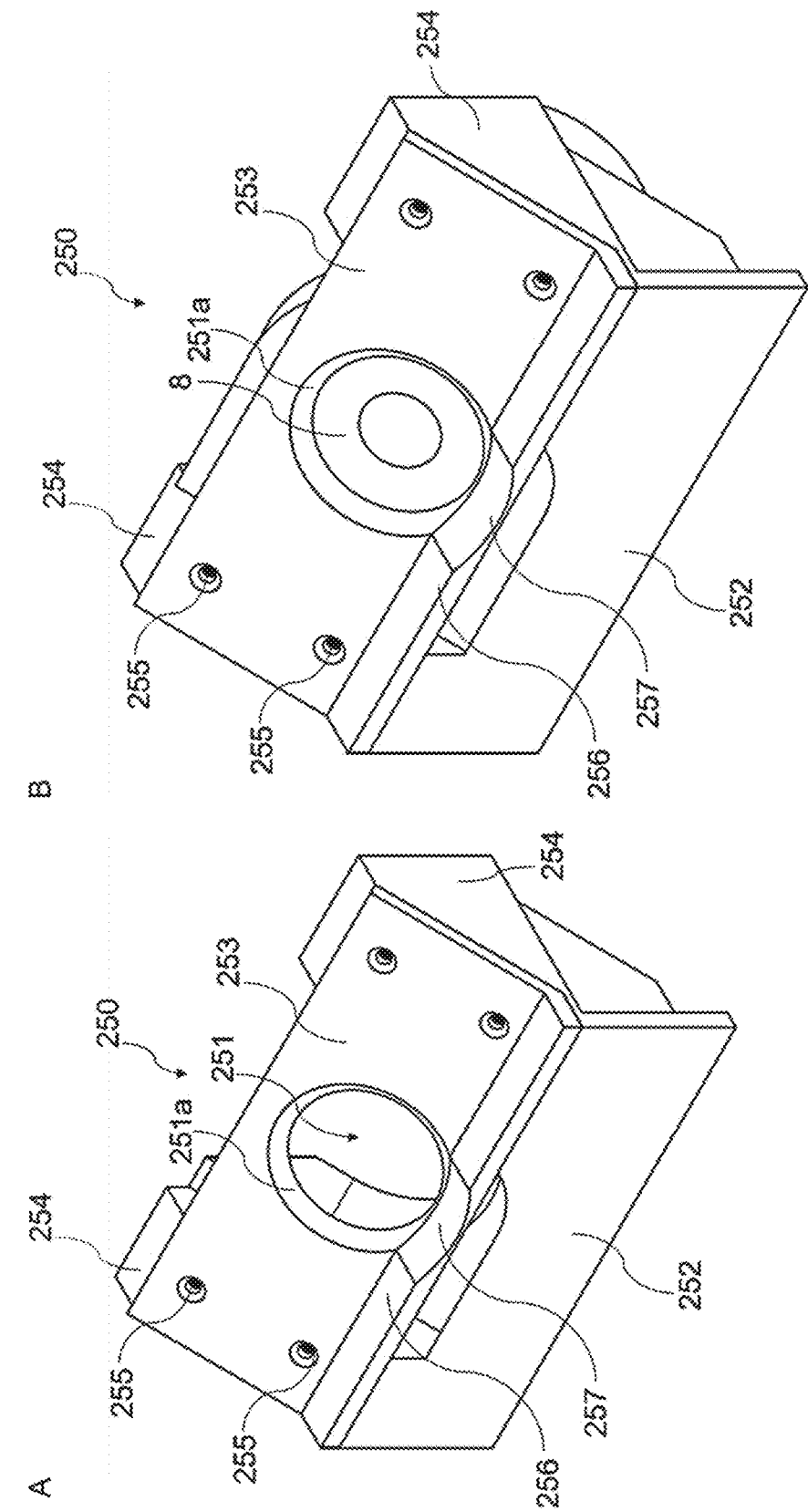
FIG. 14 shows perspective views of an adapter of the preparation station according to the invention with (B) and without (A) a transfer receptacle held by the adapter.

The coolant tank 113 comprises a coolant outlet 115 in the first compartment 101 and a dispensing mechanism 114 configured to open the coolant outlet 115 and dispense cryogenic coolant into the first compartment 101. In particular, the coolant tank 113 may be used to dispense cryogenic coolant into reservoirs of the preparation station 2, or transfer receptacle 8 (see FIG. 14) inside the first compartment 101.

Furthermore, as best illustrated in FIG. 2, the workstation 1 comprises a loading lock 118 comprising a second compartment 119 as well as a first gate 120 connecting the first compartment 101 and the second compartment 119 and a second gate 121 connecting the second compartment 119 to the exterior of the workstation 1. In the embodiment shown in FIG. 2, the first compartment 101 and the second compartment 119 are connected by a second gas inlet 122, which is used to provide an overpressure of the dry gas in the second compartment 119. Alternatively, the second compartment 119 may be directly connected to the gas reservoir 103 or another gas reservoir to provide the overpressure and the second compartment 119. The loading lock 118 may be used to transport components into the first compartment 101 or remove components from the first compartment 101 without releasing the overpressure and without transporting moisture into the dry atmosphere of the first compartment 101.

The workstation 1 may further comprise one or several heating elements 123 (see FIG. 1), which can be used to heat the first compartment 101 or specified areas of the first compartment 101, for instance, to evaporate residual moisture on manipulation tools or other components. The heating elements 123 are controlled by a control device 123a.

Referring to FIG. 2, the workstation 1 may further comprise a pump inlet 125 connected to a vacuum pump 124. For example, the pump inlet 125 may be connected to a valve 45 of the transfer device 4 to evacuate the chamber 41 of the transfer device 4 (see FIG. 5). The pump inlet 125 may be arranged outside of the first compartment 101 (as depicted in FIG. 2) or alternatively inside of the first compartment 101 to evacuate an alternative transfer device which is not provided in the first compartment through the port 109, but for example through the loading lock 118.

Figure 4:
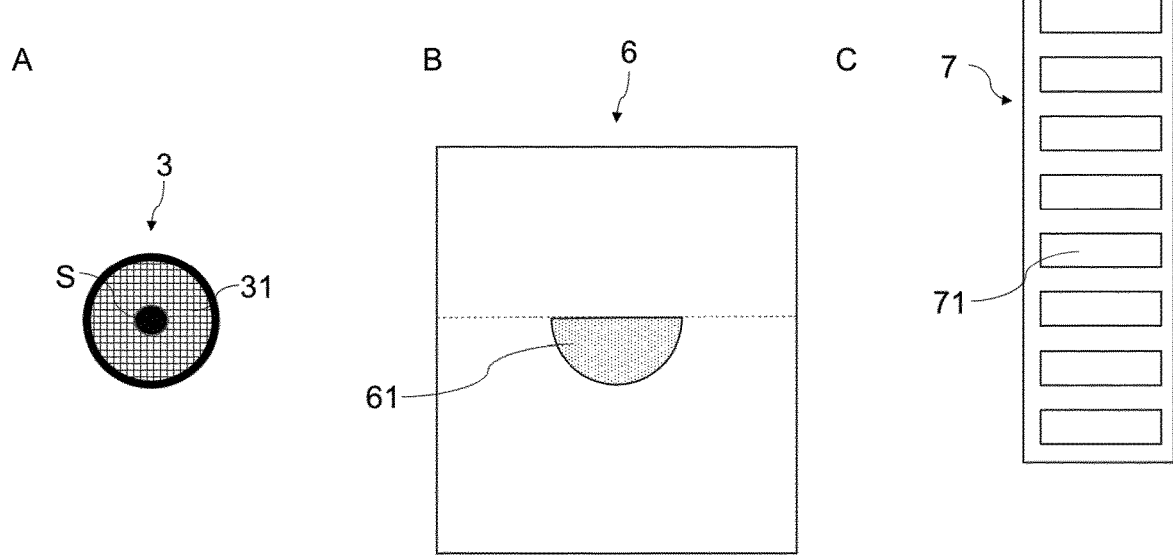
FIG. 4 shows examples of an EM grid assembly (A), a shuttle for holding the EM grid assembly (B) and a cassette for holding the EM grid assembly (C), which may be used in the method according to the invention.

FIG. 4A-C show different components used in the method according to the present invention. FIG. 4A depicts an EM grid assembly 3 comprising an electron microscopy grid 31, e.g., from copper coated by a carbon material, and a sample S disposed on the grid 31. FIG. 4B shows a shuttle 6 configured to be inserted in a preparation device, such as a cryogenic focused ion beam milling device. The shuttle 6 comprises a slot 61 for receiving an EM grid assembly 3, such as shown in FIG. 4A. FIG. 4C illustrates schematically a cassette 7 for insertion into an imaging device, particularly a cryo-electron microscope. The cassette 7 comprises several slots 71 for receiving an EM grid assembly 3, such as shown in FIG. 4A.

Figure 5:
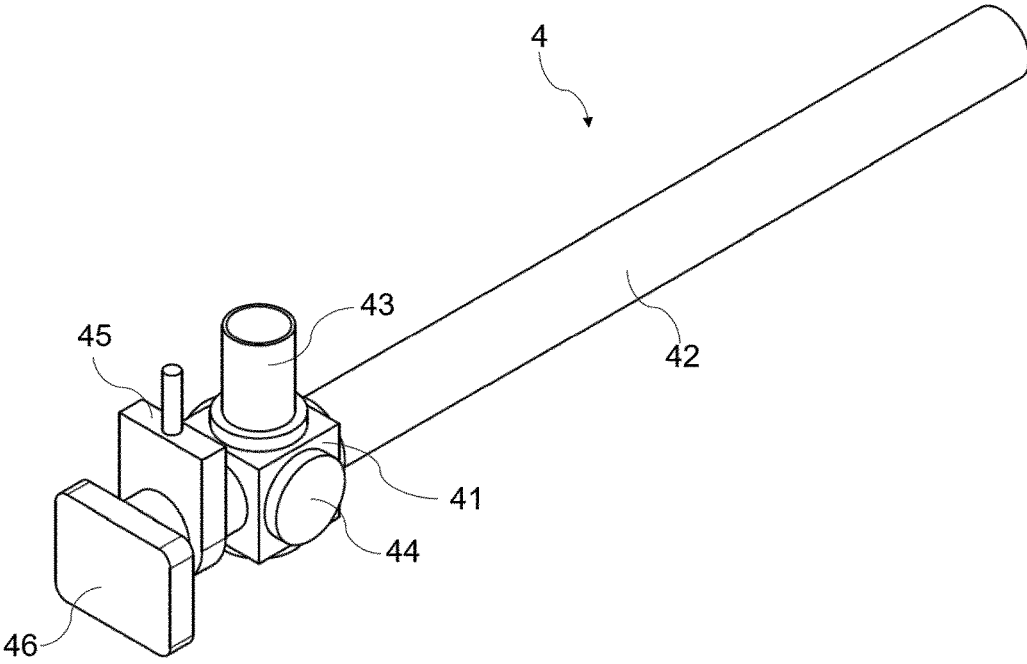
FIG. 5 shows an example of a transfer device for an EM grid assembly.

FIG. 5 shows an example of a transfer device 4 for an EM grid assembly 3 (such as shown in FIG. 4A). The transfer device 4 comprises an elongated outer rod 42, in which particularly an inner rod comprising a tip with a connection mechanism for shuttle 6 (see FIG. 4B) is slidably arranged (not shown). The transfer device 4 further comprises a chamber 41 for storing the shuttle 6 with the EM grid assembly 3 arranged thereon. In particular, a thermally conductive block, for example a copper block disposed in the chamber 41 is in thermal contact with the coolant reservoir 43, such that the shuttle 6 may be cooled to cryogenic temperatures when a cryogenic coolant is contained in the coolant reservoir 43 and the shuttle 6 is in a parking position in contact with the block. In addition, the chamber 41 comprises a window 44 for viewing the shuttle 6 in the chamber 41. A valve 45 of the transfer device 4 can be used to provide a vacuum in the chamber 41, e.g. by connecting a vacuum pump 124 to a port of the valve 45. Finally, the transfer device 4 comprises an adapter 46 for connecting the transfer device 4 to the port 109 of the workstation 1, and to a port of a preparation device, e.g., the cryo-FIB device.

FIGS. 6 to 14 depict different components of the preparation station 2 according to the invention. The preparation station 2 may be used in the first compartment 101 of the workstation 1 according to the invention or separately from the workstation 1.

Figure 6:
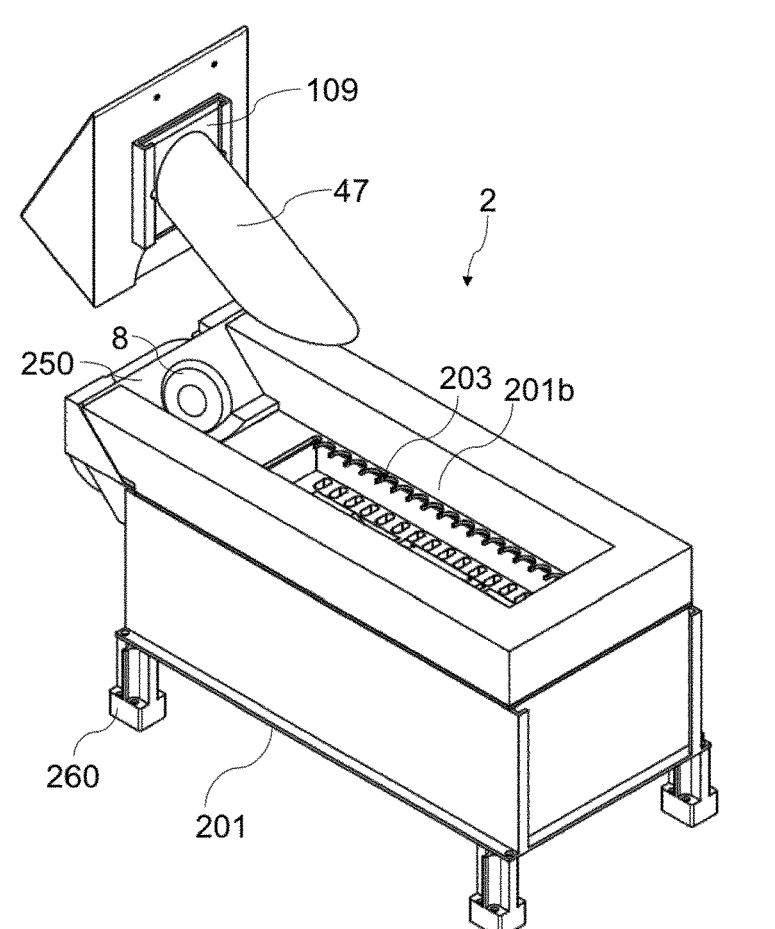
FIG. 6 shows a perspective view of a preparation station according to the invention.

FIG. 6 depicts a perspective view of the assembled preparation station 2, showing the first coolant reservoir 201 for containing a cryogenic coolant such as liquid nitrogen and tool holders 203 configured to hold respective manipulation tools, such that they are submerged in the cryogenic coolant to cool the manipulation tools prior to manipulating the EM grid assembly 3 at cryogenic temperatures. The first coolant reservoir 201 is resting on four feet 260, each being configured to be fixed to a first guide rail 116 and/or a second guide rail 117 of the workstation 1, when the preparation station 2 is arranged in the first compartment 101 of the workstation 1 (see FIG. 7).

A collar 201b is further arranged on top of the first coolant reservoir 201 to thermally isolate the first coolant reservoir 201 and protect the hands of a user manipulating the EM grid assembly 3 using the preparation station 2. In particular, an atmosphere of evaporated cryogenic coolant, which is almost free from contaminants forms below the collar 201b and protects the sample from contamination. In particular, the collar 201b may be applied when the preparation station 2 is used outside of the workstation 1.

FIG. 6 further shows the port 109 of the workstation 1 with a tube 47 extending from the opening of the port 109 towards the preparation station 2. The optional tube 47 additionally protects the sample from contamination during transfer to the transfer device 4. In particular, the tube 47 is constantly evacuated to provide an environment substantially free from contaminants. The tube 47 be applied when the preparation station 2 is used in the first compartment 101 of the workstation 1 (see FIG. 7) or outside of the workstation 1. An adapter 250 is attached to the preparation station 2 on one side of the first coolant reservoir 201, the adapter 250 holding a transfer receptacle 8 configured to receive a cassette 7 for holding the EM grid assembly 3 and configured to be inserted into an imaging device, such as a cryo-electron microscope.

Figure 7:
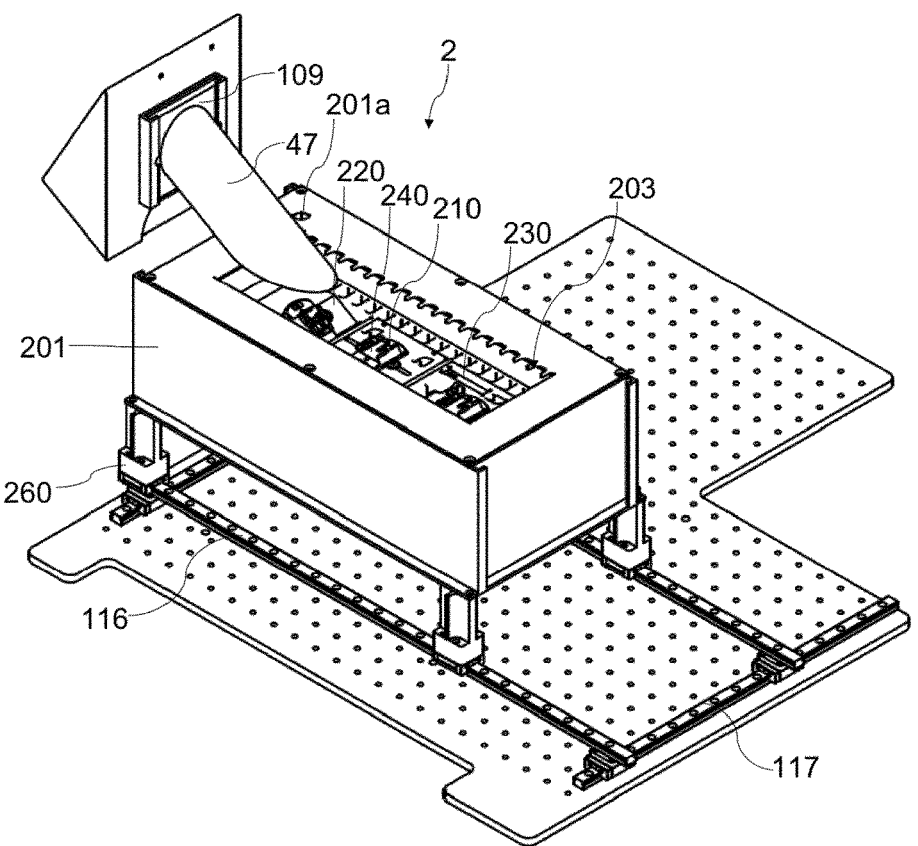
FIG. 7 shows a perspective view of a preparation station according to the invention connected to guide rails of the workstation according to the invention.

FIG. 7 is a view of the assembled preparation station 2 arranged inside of the first compartment 101 of the workstation 1 according to the invention (see FIG. 1). The feet 260 of the preparation station 2 are slidably connected to two parallel first guide rails 116 of the workstation 1 which are fixed on a bottom plate of the workstation 1, such that the preparation station 2 can be moved parallel to the window 108 (see FIG. 3) in the first compartment 101 of the workstation 1. The first guide rails 116 are further slidably connected to two second guide rails 117 of the workstation 1, which are arranged perpendicular to the first guide rails 116. Thereby, the first guide rails 116 together with the preparation station 2 can be slidably moved along the second guide rails 117 perpendicular to the window 108. In this manner, the preparation station 2 can be conveniently moved to a desired location in the first compartment 101 of the workstation 1.

FIG. 7 further shows a first part 210, a second part 220 and a third part 230 of the preparation station 2 arranged in a second coolant reservoir 202 (see FIG. 9) disposed within the first coolant reservoir 201.

Figure 8:
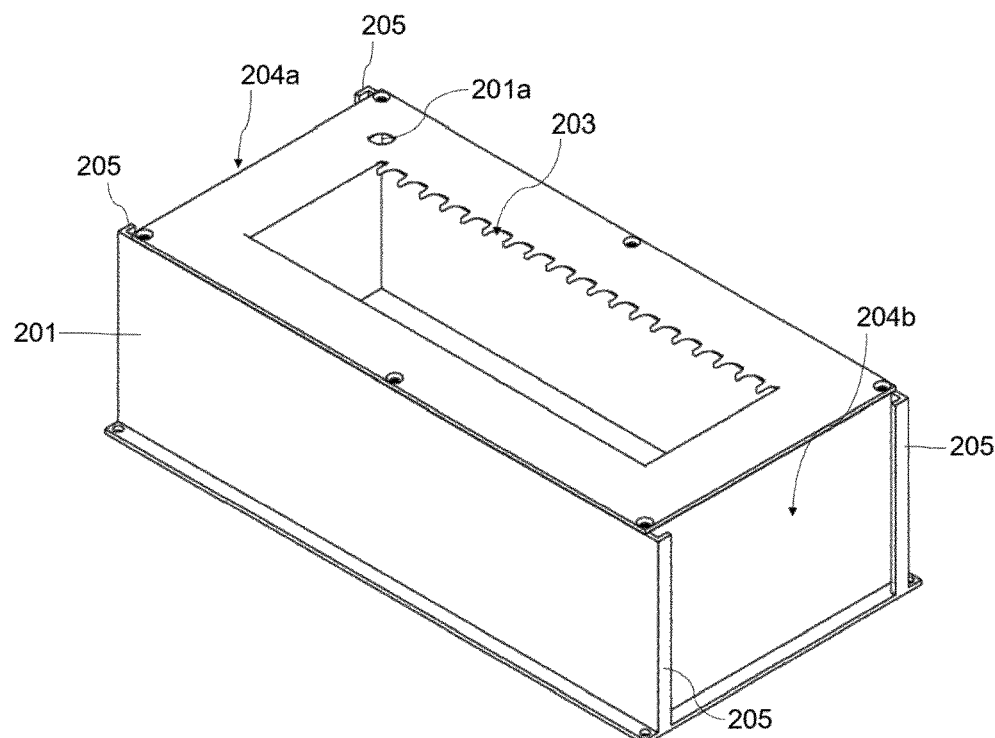
FIG. 8 depicts a perspective view of a first coolant reservoir of a preparation station according to the invention.

FIG. 8 is a perspective detailed view of the first coolant reservoir 201 without the other components of the preparation station 2. A first slot 204a and a second slot 204b for receiving the adapter 250 for holding a transfer receptacle 8 (see FIG. 14) are arranged on opposite sides of the first coolant reservoir 201. In this manner, the adapter 250 may be arranged on either side of the first coolant reservoir 201, particularly as required by left and right-handed operators. The slots 204a, 204b are each formed by opposing latches 205. FIG. 8 further shows an opening 201a for providing cryogenic coolant in the first coolant reservoir 201.

In particular, the first reservoir 201 comprises an inner part consisting of a thermally isolating material and an outer part (e.g. an outer frame), the outer part being particularly formed from a plastic material (the inner part is not shown). In particular, the inner part is configured to contain the cryogenic coolant and thermally isolate the outer part from the cryogenic coolant contained in the inner part, more particularly such that the outer part remains at ambient temperature when the cryogenic coolant is contained in the inner part.

Figure 9:
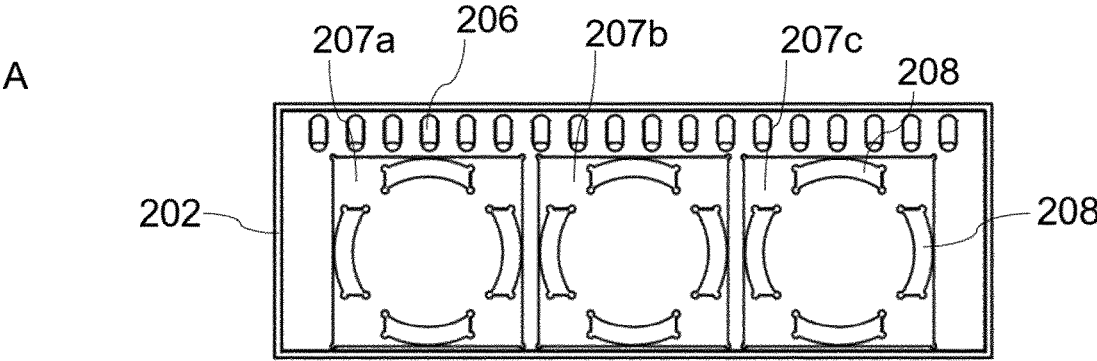
FIG. 9 shows a top view (A) and a perspective view (B) of a second coolant reservoir of the preparation station according to the invention.
Figure 9:
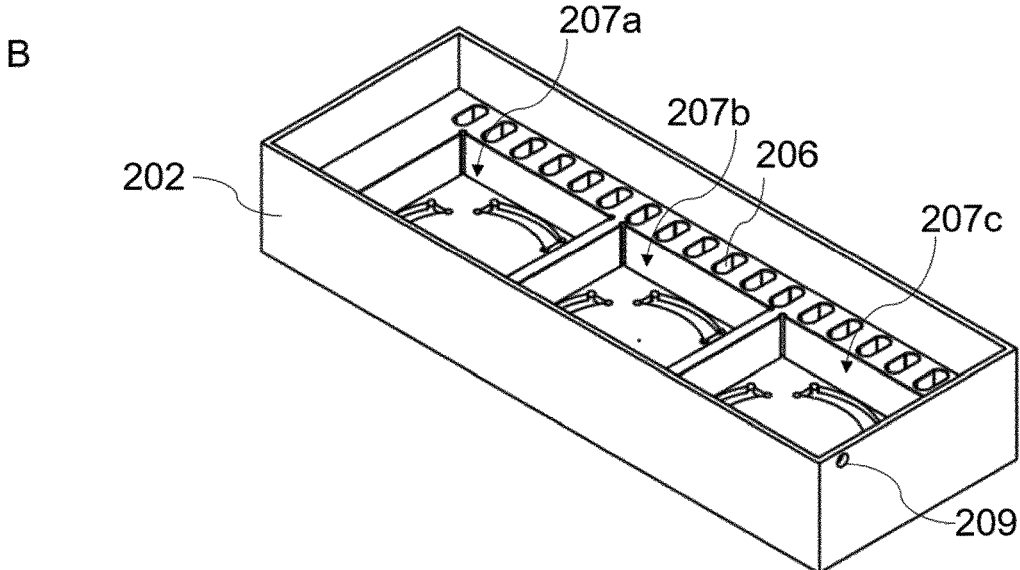

FIG. 9 depicts in a top view (A) and a perspective view (B) a second coolant reservoir 202 configured to be inserted in the first coolant reservoir 201. The second coolant reservoir 202 comprises a through-hole 209 configured such that cryogenic coolant filled into the second coolant reservoir 202 enters the first coolant reservoir 201 via the through-hole 209, when the second coolant reservoir 202 is placed within the first coolant reservoir 201. As shown in FIG. 9, the second coolant reservoir 202 further comprises a first slot 207a, a second slot 207b and a third slot 207c, configured to receive the first part 210, the second part 220 and the third part 230, respectively, particularly in any desired order or arrangement. The slots 207a, 207b and 207c may optionally contain fourth slots 208, particularly four fourth slots 208 each, which are arranged in a circle (see FIG. 9A). The fourth slots 208 are particularly configured to receive an additional module such as a clipping station configured for clipping of electron microscopy grids. Furthermore, FIG. 9 shows tool slots 206 configured to receive respective manipulation tools when the manipulation tools are received by the tool holders 203 of the first coolant reservoir 201.

Figure 10:
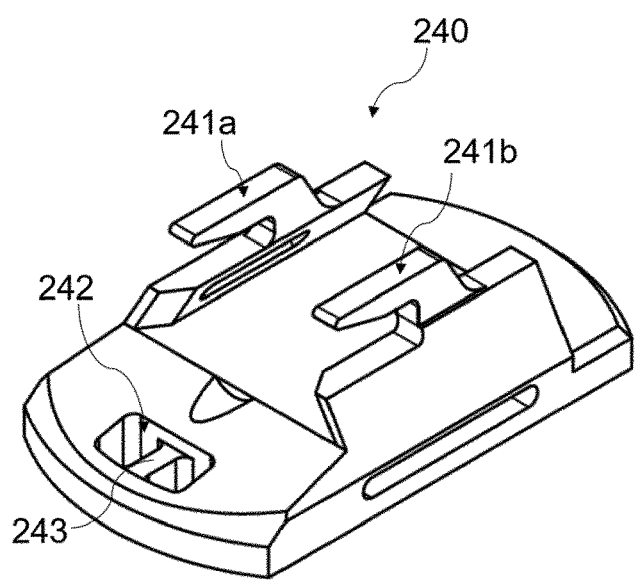
FIG. 10 depicts a perspective view of a removable holder for a shuttle for holding an EM grid assembly according to the invention.
Figure 11:
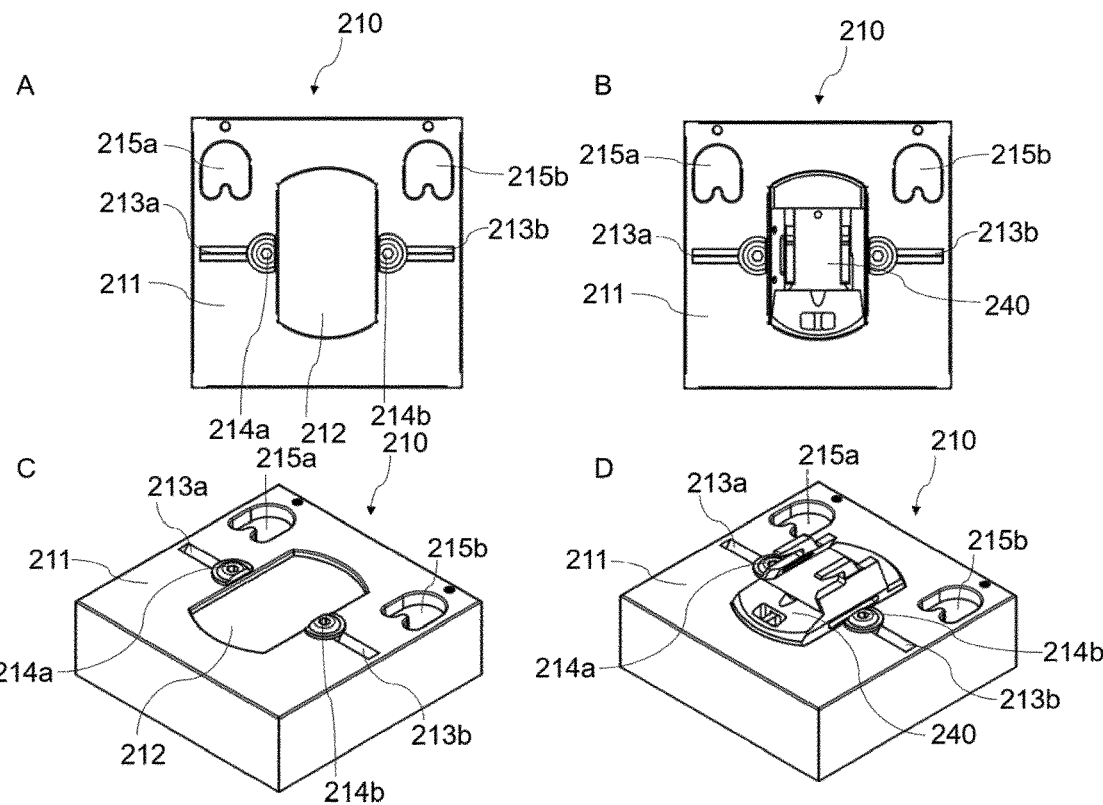
FIG. 11 shows top views (A, B) and perspective views (C, D) of the first part of the preparation station according to the invention, with (B, D) and without (A, C) the removable holder according to FIG. 10.
Figure 12:
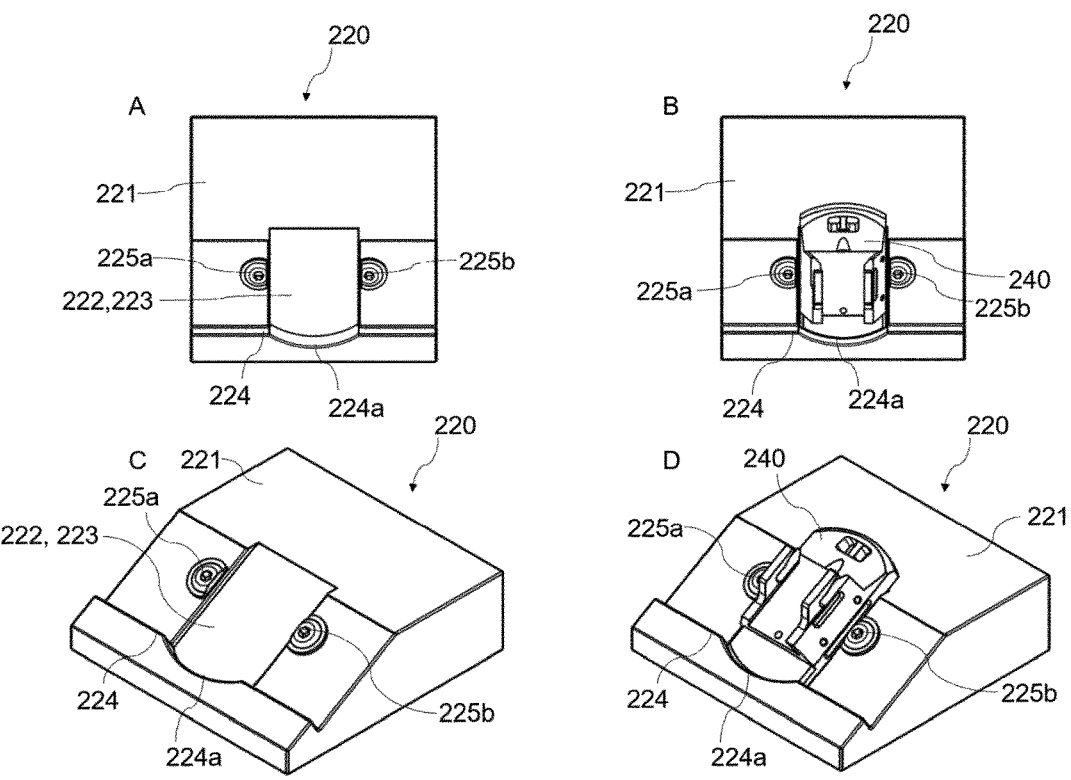
FIG. 12 shows top views (A, B) and perspective views (C, D) of the second part of the preparation station according to the invention, with (B, D) and without (A, C) the removable holder according to FIG. 10.

FIG. 10 depicts a removable holder 240 configured to receive the shuttle 6 (see FIG. 4B). The removable holder 240 comprises a first holding element 241a and a second holding element 241b for holding the shuttle 6 in a fixed orientation. In addition, the holder 240 comprises a first groove 242 comprising a protrusion 243 arranged in the first groove 242. The protrusion 243 is configured such that the removable holder 240 can be gripped by a gripping tool by inserting the gripping tool into the first groove 242 and gripping the protrusion 243.

FIG. 11A-D show a first part 210 of the preparation station 2 according to the invention as top views (A-B) and perspective views (C-D). The first part 210 comprises an upper surface 211 and a first recess 212 extending parallel to the upper surface 211, wherein the first recess 212 is configured to receive the removable holder 240 (FIGS. 11A and C show the first part 210 without the removable holder 240, and FIGS. 11 B and D show the first part 210 with the removable holder 240 arranged in the first recess 212).

The first part 210 further comprises a first hole 214a and a second hole 214b configured to each receive a respective screw to fix the removable holder 240 in the first recess 212. Furthermore, the first part 210 comprises alignment grooves 213a, 213b on either side of the first recess 212. The alignment grooves 213a, 213b are particularly V-shaped in cross-section, and their depth is dimensioned such that an EM grid assembly 3 inserted into a respective alignment groove 213a, 213b protrudes with its upper edge from the alignment groove 213a, 213b and is in a tilted orientation with respect to the upper surface 211. In this manner, the EM grid assembly 3 can be easily rotated around its central axis to align the EM grid assembly 3 using a manipulation tool. Since an alignment groove 213a, 213b is provided on either side of the first recess 212, users may choose the desired alignment groove 213a, 213b according to their preferences, for instance, depending on if they are left-handed or right-handed. The first part 210 further comprises second recesses 215a, 215b arranged on either side of the first recess 212 above the alignment grooves 213a, 213b. The second recesses 215a, 215b are each configured to receive a respective container for storing one or several EM grid assemblies 3. Left and right-handed users may choose the respective second groove 215a, 215b according to their preferences or may use both second grooves.

FIG. 12A-D show a second part 220 of the preparation station 2 according to the invention as top views (A-B) and perspective views (C-D). The second part 220 comprises an upper surface 221 and a second recess 222 comprising a surface 223 which is tilted in respect of the first surface 221. The second recess 222 of the second part 220 is configured to receive the removable holder 240 in a tilted orientation with respect to the upper surface 221 (FIGS. 12A and C show the second part 220 without the removable holder 240, and FIGS. 12 B and D show the second part 220 with the removable holder 240 arranged in the second recess 222).

The second part 220 further comprises a first hole 225a and a second hole 225b configured to each receive a respective screw to fix the removable holder 240 in the second recess 222. Moreover, the second part 220 comprises an edge 224 below the second recess 222, wherein the edge 224 comprises a rounded cut-out 224a configured such that the removable holder 240 can be easily accessed from below and particularly be removed from the second part 220 from the rounded cut-out 224a.

FIG. 13A-D show a third part 230 of the preparation station 2 according to the invention as top views (A-B) and perspective views (C-D). The depicted embodiment of the third part 230 is particularly designed to be used by right-handed users. Particularly, a mirrored version of the third part 230 specifically designed for left-handed users is also envisioned within the scope of the present invention. The third part 230 comprises an upper surface 231, a third recess 232 for receiving a cassette 7, a fourth recess 234 (with a surface extending parallel to the upper surface 231) for receiving the removable holder 240, and a fifth recess 238 for receiving a cassette 7. FIGS. 13 A and C show the third part 230 without the removable holder 240, and FIGS. 13 B and D show the third part 230 with the removable holder 240 arranged in the fourth recess 234.

Figure 13:
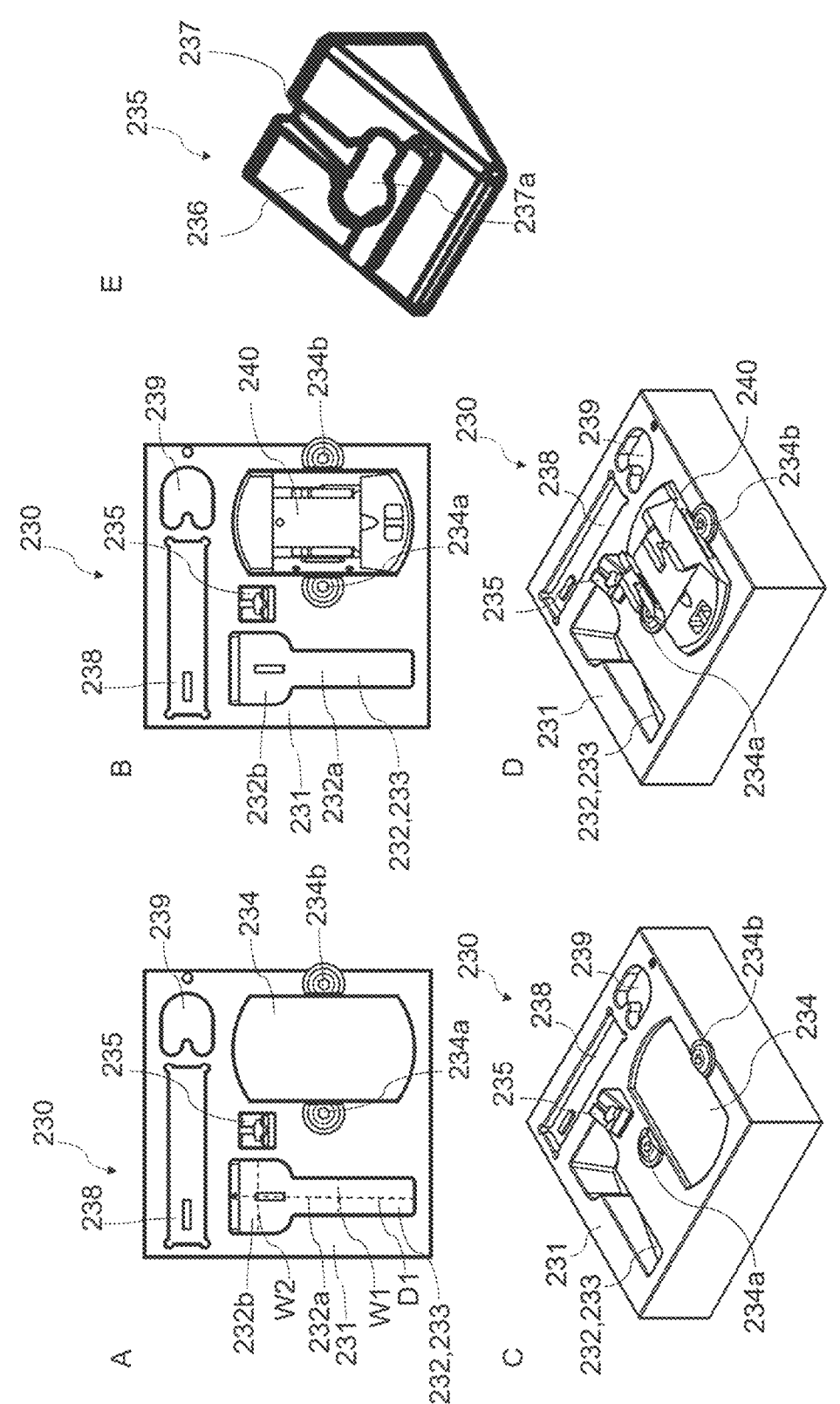
FIG. 13 shows top views (A, B) and perspective views (C, D) of the third part of the preparation station according to the invention, with (B, D) and without (A, C) the removable holder according to FIG. 10, and FIG. 13 E shows a detail of the alignment platform of the third part.

As best seen in FIGS. 13A and B, the third recess 232 comprises a first section 232a and a second section 232b arranged along a first direction D1, wherein the first section 232a has a first width W1, and wherein the second section 232b has a second width W2 perpendicular to the first direction D1, wherein the second width W2 is greater than the first width W1. As apparent from the perspective view in FIGS. 13 C and D, the third recess 232 has a bottom surface 233 which is tilted in respect of the upper surface 231 of the third part 230, and wherein the depth of the third recess 232 increases in the first direction D1, that is towards the second section 232b. The fifth recess 238 has a bottom surface that is parallel to the upper surface 231 and comprises a uniform width along its length.

The third part 230 further comprises a first hole 234a and a second hole 234b on either side of the fourth recess 234 configured to each receive a respective screw to fix the removable holder 240 in the fourth recess 234.

An alignment platform 235 for aligning an EM grid assembly 3 is arranged between the third recess 232 and the fourth recess 234. A detailed perspective view of the alignment platform 235 is provided in FIG. 13 E. The alignment platform 235 comprises a surface 236 which is tilted in respect of the upper surface 231, a slot 237 for inserting a manipulation tool and a groove 237a, particularly a circular groove 237a, for receiving the EM grid assembly 3, wherein the groove 237a is arranged adjacent to the slot 237 and is connected to the slot 237. The slot 237 comprises a bottom surface which is tilted in respect of the upper surface 231 of the third part 230 and tilted in respect of the surface 236 of the alignment platform 235, wherein the angle between the bottom surface of the slot 237 and the upper surface 231 is smaller than the angle between the surface 236 and the upper surface 231. In other words, the inclination of the slot 237 is less than the inclination of the surface 236 of the alignment platform 235. The slot 237 and the groove 237*a* are configured (that is dimensioned and arranged in respect of each other) that the EM grid assembly 3 can be inserted into the groove 237*a* using a manipulation tool, such as tweezers, and aligned rotationally around its central axis by a manipulation tool, particularly tweezers, to obtain a desired orientation of the EM grid assembly 3, while the manipulation tool is inserted into the slot 237.

Moreover, the third part 230 comprises a sixth recess 239 configured to receive a container for one or several EM grid assemblies 3.

In particular, during use of the preparation station 2, the first part 210, the second part 220 and the third part 230 are arranged in the second coolant reservoir 202 of the preparation station 2, which in turn is placed in the first coolant reservoir 201, and thus the first part 210, the second part 220 and the third part 230 are submerged in cryogenic coolant. In particular, the preparation station 2 is provided in the first compartment 101 of the workstation 1.

The shuttle 6 is then received in the holding elements 241*a*, 241*b* of the removable holder 240, and the holder 240 is placed in the first recess 212 of the first part 210 and optionally fixed by screws placed in the holes 213*a*, 213*b*. An EM grid assembly 3 with a vitrified sample S thereon is subsequently supplied, e.g. in a storage container which is placed in one of the second recesses 215*a*, 215*b* of the first part 210. The EM grid assembly 3 of interest is then removed from the container using a manipulation tool and placed in one of the alignment grooves 213*a*, 213*b* for rotational alignment by the manipulation tool. After the desired orientation of the EM grid assembly 3 is obtained, the EM grid assembly 3 is placed in the shuttle 6 held by the removable holder 240 in the first recess 212 of the first part 210.

Subsequently, the removable holder 240 with the shuttle 6 and the EM grid assembly 3 therein is placed in the second recess 222 of the second part 220, and optionally fixed by screws using the holes 225*a*, 225*b*. A transfer device 4 is then advanced with the tip of its inner rod to the shuttle 6, connected to the shuttle 6, and the shuttle 6 is inserted into the chamber 41 of the transfer device 4. Thereafter the shuttle 6 is transported to the preparation device, particularly the cryo-FIB device by the transfer device 4, wherein the shuttle 6, which is arranged in the chamber 41 is cooled to cryogenic temperatures and the chamber 41 evacuated. The shuttle 6 is inserted into the preparation device, and preparation of the sample S, particularly thinning by FIB, is initiated. When preparation is completed, the shuttle 6 is inserted back into the transfer device 4 and particularly removed from the transfer device 4 back into the removable holder 240 of the preparation station 2, e.g. in the first compartment 101 of the workstation 1.

The removable holder 240 is then inserted into the fourth recess 234 of the third part 230, and the holder 240 is optionally fixed with screws using the holes 234*a*, 234*b*. Subsequently, a cassette 7 is particularly placed in the third recess 232 of the third part 230. The EM grid assembly 3 is removed from the shuttle 6, optionally aligned on the alignment platform 235, and placed in the cassette 7 in the correct orientation. The cassette 7 may then be transferred from the third recess 232 to the fifth recess 238, and moved into the transfer receptacle 8, particularly containing a cryogenic coolant. Alternatively, the cassette 7 may be directly transferred from the third recess 232 to the transfer receptacle 8. The transfer receptacle 8 is then inserted into an imaging device, e.g. a cryo-electron microscope, and the sample S is imaged. The transfer receptacle 8 is optionally held by the adapter 250 during insertion of the cassette 7 into the transfer receptacle 8. Subsequently, the transfer receptacle 8 can be inserted into a cryo-electron microscope, particularly for cryo-electron tomography.

In an alternative method that can be performed using the preparation station 2 according to the invention, an EM grid assembly 3, particularly containing a vitrified sample S for single particle analysis by cryo-electron microscopy, is provided, particularly in a container inserted into the sixth recess 239 of the third part 230. The EM grid assembly 3 is then directly transferred from the container into a cassette 7, particularly inserted into the fifth recess 238. Subsequently, the cassette 7 is transferred from the fifth recess 238 to the transfer receptacle 8, and the transfer receptacle 8 is inserted into a cryo-electron microscope for single particle analysis.

FIGS. 14A and B show details of the adapter 250 that can be attached to either side of the first coolant reservoir 201 of the preparation station 2, as shown in FIG. 6. FIG. 14A depicts the adapter 250 without the transfer receptacle 8, and FIG. 14B depicts the adapter 250 with the transfer receptacle 8 held by the adapter 250. The adapter 250 comprises a fixing plate 252 and a supporting plate 253, wherein the fixing plate 252 is attached to the supporting plate 253, particularly by means of screws inserted through the bores 255 of the supporting plate 253 into the connecting sections 254 of the fixing plate 252, and wherein the supporting plate 253 is tilted in respect of the fixing plate 252. The supporting plate 253 comprises a through-hole 251 with a tapered rim 251*a*, wherein the through-hole 251 is configured to be aligned with an opening of the transfer receptacle 8. The adapter 250 further comprises an edge 256 with a cut-out 257 adjacent to the through-hole 251.

| List of reference numerals | |
| --- | --- |
| Workstation | 1 |
| Preparation station | 2 |
| Electron microscopy grid assembly | 3 |
| Transfer device | 4 |
| Shuttle | 6 |
| Cassette | 7 |
| Transfer receptacle | 8 |
| Grid | 31 |
| Chamber | 41 |
| Outer rod | 42 |
| Coolant reservoir | 43 |
| Window of transfer device | 44 |
| Valve | 45 |
| Adapter | 46 |
| Tube | 47 |
| Slot of shuttle | 61 |
| Slot of cassette | 71 |
| First compartment | 101 |
| First gas inlet | 102 |
| Gas reservoir | 103 |
| First glove | 104 |
| Second glove | 105 |
| Opening | 106, 107 |
| Window | 108 |
| Port | 109 |
| Finger section | 110 |
| Tip | 111 |
| Hole | 112 |
| Coolant tank | 113 |
| Dispensing mechanism | 114 |
| Coolant outlet | 115 |

-continued

| List of reference numerals | |
| --- | --- |
| First guide rail | 116 |
| Second guide rail | 117 |
| Loading lock | 118 |
| Second compartment | 119 |
| First gate | 120 |
| Second gate | 121 |
| Second gas inlet | 122 |
| Heating element | 123 |
| Control device | 123a |
| Vacuum pump | 124 |
| Pump inlet | 125 |
| Coolant inlet | 126 |
| First coolant reservoir | 201 |
| Opening | 201a |
| Collar | 201b |
| Second coolant reservoir | 202 |
| Tool holder | 203 |
| First slot | 204a |
| Second slot | 204b |
| Latch | 205 |
| Tool slot | 206 |
| First slot of second coolant reservoir | 207a |
| Second slot of second coolant reservoir | 207b |
| Third slot of second coolant reservoir | 207c |
| Fourth slot of second coolant reservoir | 208 |
| Through-hole | 209 |
| First part | 210 |
| Upper surface of first part | 211 |
| First recess | 212 |
| Alignment groove | 213, 213a, 213b |
| First hole | 214a |
| Second hole | 214b |
| Second recess | 215, 215a, 215b |
| Second part | 220 |
| Upper surface of second part | 221 |
| Second recess | 222 |
| Surface of second recess | 223 |
| Edge | 224 |
| Rounded cut-out | 224a |
| First hole | 225a |
| Second hole | 225b |
| Third part | 230 |
| Upper surface of third part | 231 |
| Third recess | 232 |
| First section | 232a |
| Second section | 232b |
| Surface of third recess | 233 |
| Fourth recess | 234 |
| First hole | 234a |
| Second hole | 234b |
| Alignment platform | 235 |
| Surface of alignment platform | 236 |
| Slot | 237 |
| Groove | 237a |
| Fifth recess | 238 |
| Sixth recess | 239 |
| Removable holder | 240 |
| First holding element | 241a |
| Second holding element | 241b |
| First groove | 242 |
| Protrusion | 243 |
| Adapter | 250 |
| Through-hole | 251 |
| Tapered rim | 251a |
| Fixing plate | 252 |
| Supporting plate | 253 |
| Connecting section | 254 |
| Bore | 255 |
| Edge | 256 |
| Cut-out | 257 |
| Foot | 260 |
| First direction on third part | D1 |
| Gas flow | G |
| Sample | S |
| First width | W1 |
| Second width | W2 |

The invention claimed is:

1. A workstation (1) for manipulating an electron microscopy grid assembly (3), comprising a first compartment (101), a first gas inlet (102) for providing a gas flow (G) of a dry gas from a gas reservoir (103) into the first compartment (101), wherein the workstation (1) is configured such that an overpressure can be generated in the first compartment (101) relative to an exterior of the workstation (1) by the gas flow (G), a first glove (104) and a second glove (105), each being fixed in a respective opening (106, 107) of the workstation (1) wherein the first glove (104) and the second glove (105) are configured such that a respective hand of a user may be inserted into the first glove (104) or second glove (105) from the exterior, wherein the first glove (104) and the second glove (105) are movable in the first compartment (101) to manipulate objects in the first compartment (101) using the respective hand of the user, wherein the workstation (1) comprises a port (109) for providing a transfer device (4) for an electron microscopy grid assembly (3) in the first compartment (101) from the exterior, to insert the electron microscopy grid assembly (3) into the transfer device (4) or remove the electron microscopy grid assembly (3) from the transfer device (4) in the first compartment (101), and wherein the workstation (1) comprises a pump inlet (125), wherein the pump inlet (125) is configured to be connected to a vacuum pump (124), wherein the vacuum pump (124) is configured to evacuate a chamber (41) of the transfer device (4) when the transfer device (4) is arranged in the port (109) of the workstation (1).

2. The workstation (1) according to claim 1, characterized in that the first glove (104) and the second glove (105) each comprise a plurality of finger sections (110), wherein each finger section (110) of the first glove (104) and the second glove (105) is configured to receive a respective finger of a respective hand of the user, wherein each finger section (110) of the first glove (104) and the second glove (105) comprises a respective hole (112) at a tip (111) of the respective finger section (110) wherein the respective hole (112) is configured to allow the respective finger to extend into the first compartment (101) through the respective hole (112).

3. The workstation (1) according to claim 1, characterized in that the workstation (1) comprises a coolant tank (113) for storing a cryogenic coolant, wherein the workstation (1) comprises a dispensing mechanism (114) configured to dispense the cryogenic coolant from the coolant tank (113) through a coolant outlet (115) into the first compartment (101).

4. The workstation (1) according to claim 1, characterized in that the workstation (1) comprises a first guide rail (116) for slidably moving a preparation station (2) for manipulating an electron microscopy grid assembly (3).

5. The workstation (1) according to claim 1, characterized in that the workstation (1) comprises a loading lock (118) enclosing a second compartment (119), wherein the loading lock (118) comprises a first gate (120) connecting the second compartment (119) to the first compartment (101) of the workstation (1), and wherein the loading lock (118) comprises a second gate (121) connecting the second compartment (119) to the exterior, wherein the workstation (1) comprises a second gas inlet (122) configured to provide a gas flow (G) of the dry gas into the second compartment (119), such that an overpressure can be generated in the second compartment (119) relative to the exterior by the gas flow (G).

6. The workstation (1) according to claim 1, characterized in that the workstation (1) comprises at least one heating element (123) for heating the first compartment (101).

7. A method for manipulating an electron microscopy grid assembly (3) comprising the steps of a. providing a workstation (1) according to claim 1,
   b. providing a gas flow (G) of a dry gas to generate an overpressure in the first compartment (101) of the workstation (1) in respect of the exterior of the workstation (1),
   c. providing in the first compartment (101) of the workstation (1), a transfer device (4) comprising a shuttle (6) and an electron microscopy grid assembly (3) comprising a sample(S), the electron microscopy grid assembly (3) being held by the shuttle (6), wherein the transfer device (4) is provided in the first compartment (101) by means of the port (109) of the workstation (1),
   d. removing the electron microscopy grid assembly (3) from the shuttle (6) in the first compartment (101),
   e. inserting the electron microscopy grid assembly (3) into a cassette (7) for holding an electron microscopy grid assembly (3) in the first compartment (101),
   f. inserting the cassette (7) into a transfer receptacle (8) in the first compartment (101),
   g. removing the transfer receptacle (8) from the workstation (1),
   h. inserting the transfer receptacle (8) into an imaging device,
   i. imaging the sample(S) on the electron microscopy grid assembly (3) by means of the imaging device.

\* \* \* \* \*